United States Patent
Shioya et al.

(10) Patent No.: US 11,561,051 B2
(45) Date of Patent: Jan. 24, 2023

(54) HEAT SINK, BOARD MODULE, TRANSMISSION DEVICE, AND METHOD OF MANUFACTURING THE HEAT SINK

(71) Applicant: FUJITSU LIMITED, Kawasaki (JP)

(72) Inventors: Yuji Shioya, Kawachi (JP); Mitsuru Etou, Fukuoka (JP); Tomoyuki Hongoh, Sano (JP); Ryo Matsumoto, Chikusei (JP); Kazuhiko Ohta, Utsunomiya (JP)

(73) Assignee: FUJITSU LIMITED, Kawasaki (JP)

( * ) Notice: Subject to any disclaimer, the term of this patent is extended or adjusted under 35 U.S.C. 154(b) by 362 days.

(21) Appl. No.: 16/812,843

(22) Filed: Mar. 9, 2020

(65) Prior Publication Data
US 2020/0300560 A1    Sep. 24, 2020

(30) Foreign Application Priority Data
Mar. 22, 2019    (JP) .............................. JP2019-055209

(51) Int. Cl.
*F28F 3/06*    (2006.01)
*F28F 3/02*    (2006.01)

(52) U.S. Cl.
CPC ................ *F28F 3/06* (2013.01); *F28F 3/027* (2013.01)

(58) Field of Classification Search
CPC ...... F28F 3/06; F28F 3/027; F28F 3/02; F28F 13/00; F28F 23/00; H01L 23/3672; H01L 23/46; H01L 23/40; H01L 23/467; F28D 2021/0028; F28D 2021/0029; F28D 15/06
USPC ...................... 165/185, 80.3, 275
See application file for complete search history.

(56) References Cited

U.S. PATENT DOCUMENTS

| | | | | |
|---|---|---|---|---|
| 5,562,146 A | * | 10/1996 | Harmon ............. | B22D 19/0063 164/112 |
| 6,085,830 A | * | 7/2000 | Mashiko ............. | H01L 21/4871 165/185 |
| 6,244,332 B1 | * | 6/2001 | Gesklin ............... | H01L 23/3672 257/E23.103 |
| 6,554,060 B2 | * | 4/2003 | Noda ........................ | F28F 3/02 174/16.3 |

(Continued)

FOREIGN PATENT DOCUMENTS

JP    H09-321186 A    12/1997
JP    2002-237555 A    8/2002

(Continued)

OTHER PUBLICATIONS

JPOA—Office Action of Japanese Patent Application No. 2019-055209 dated Oct. 25, 2022 with Machine Translation. **JP2005-203385 cited in JPOA was previously submitted in the IDS filed on Mar. 9, 2020.

*Primary Examiner* — Justin M Jonaitis
(74) *Attorney, Agent, or Firm* — Fujitsu Patent Center

(57) ABSTRACT

A heat sink includes: a base plate; and at least one fin secured to the base plate; wherein the base plate has at least one through hole that extends in a first direction parallel to a surface of the base plate, wherein the at least one fin has a projection inserted into the at least one through hole, and wherein, in a second direction that is parallel to the surface of the base plate and that is perpendicular to the first direction, both end surfaces of the projection are in contact with inner wall surfaces of the at least one through hole entirely in a third direction parallel to a thickness direction of the base plate.

10 Claims, 36 Drawing Sheets

(56) References Cited

U.S. PATENT DOCUMENTS

| | | | |
|---|---|---|---|
| 6,722,419 B1* | 4/2004 | Lee | G06F 1/20 |
| | | | 174/16.3 |
| 7,254,888 B2* | 8/2007 | Chu | F28F 3/02 |
| | | | 228/183 |
| 9,622,382 B2* | 4/2017 | Gasse | F21V 29/87 |
| 10,058,010 B2* | 8/2018 | Totani | F28F 3/06 |
| 2002/0112846 A1 | 8/2002 | Noda et al. | |
| 2016/0225691 A1* | 8/2016 | Sanda | H01L 23/3672 |
| 2018/0062225 A1* | 3/2018 | You | H01M 50/289 |

FOREIGN PATENT DOCUMENTS

| | | | |
|---|---|---|---|
| JP | 2005-203385 A | | 7/2005 |
| JP | 2011-086722 A | | 4/2011 |
| JP | 2011086722 A | * | 4/2011 |
| JP | 2015-050262 | | 3/2015 |

* cited by examiner

FIG. 7
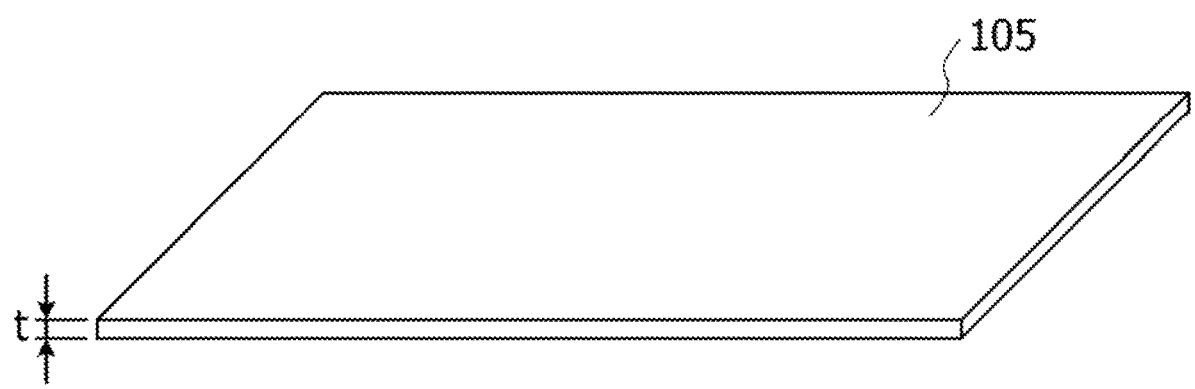
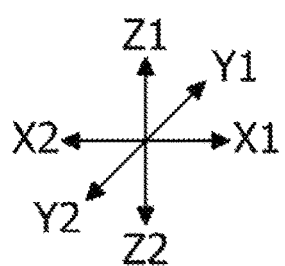

HEAT SINK, BOARD MODULE, TRANSMISSION DEVICE, AND METHOD OF MANUFACTURING THE HEAT SINK

CROSS-REFERENCE TO RELATED APPLICATION

This application is based upon and claims the benefit of priority of the prior Japanese Patent Application No. 2019-55209, filed on Mar. 22, 2019, the entire contents of which are incorporated herein by reference.

FIELD

The embodiments discussed herein are related to a heat sink, a board module, a transmission device, and a method of manufacturing the heat sink.

BACKGROUND

A transmission device in which a board module is mounted has been known. The board module includes a circuit board, a heat-generating component mounted on the circuit board, and a heat sink attached to the heat-generating component. The heat sink is used to dissipate heat generated in the heat-generating component.

Various heat sinks have been proposed for improving heat dissipation performance.

However, it is difficult to obtain sufficient heat dissipation performance with a structure which is easy to manufacture. For example, there has been proposed a heat sink in which fins are secured to grooves formed in a base plate by crimping or soldering. However, it is difficult to obtain sufficient heat dissipation performance.

Examples of related art include Japanese Laid-open Patent Publication Nos. 2002-237555, 2011-86722, 9-321186, and 2005-203385.

SUMMARY

According to an aspect of the embodiments, a heat sink includes: a base plate; and at least one fin secured to the base plate; wherein the base plate has at least one through hole that extends in a first direction parallel to a surface of the base plate, wherein the at least one fin has a projection inserted into the at least one through hole, and wherein, in a second direction that is parallel to the surface of the base plate and that is perpendicular to the first direction, both end surfaces of the projection are in contact with inner wall surfaces of the at least one through hole entirely in a third direction parallel to a thickness direction of the base plate.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram (No. 1) illustrating a method of manufacturing the heat sink according to the first embodiment;

DESCRIPTION OF EMBODIMENT(S)

An object of the present disclosure is to provide a heat sink, a board module, a transmission device, and a method of manufacturing the heat sink that may further improve heat dissipation performance.

According to the present disclosure, heat dissipation performance may be further improved.

Figure 1:
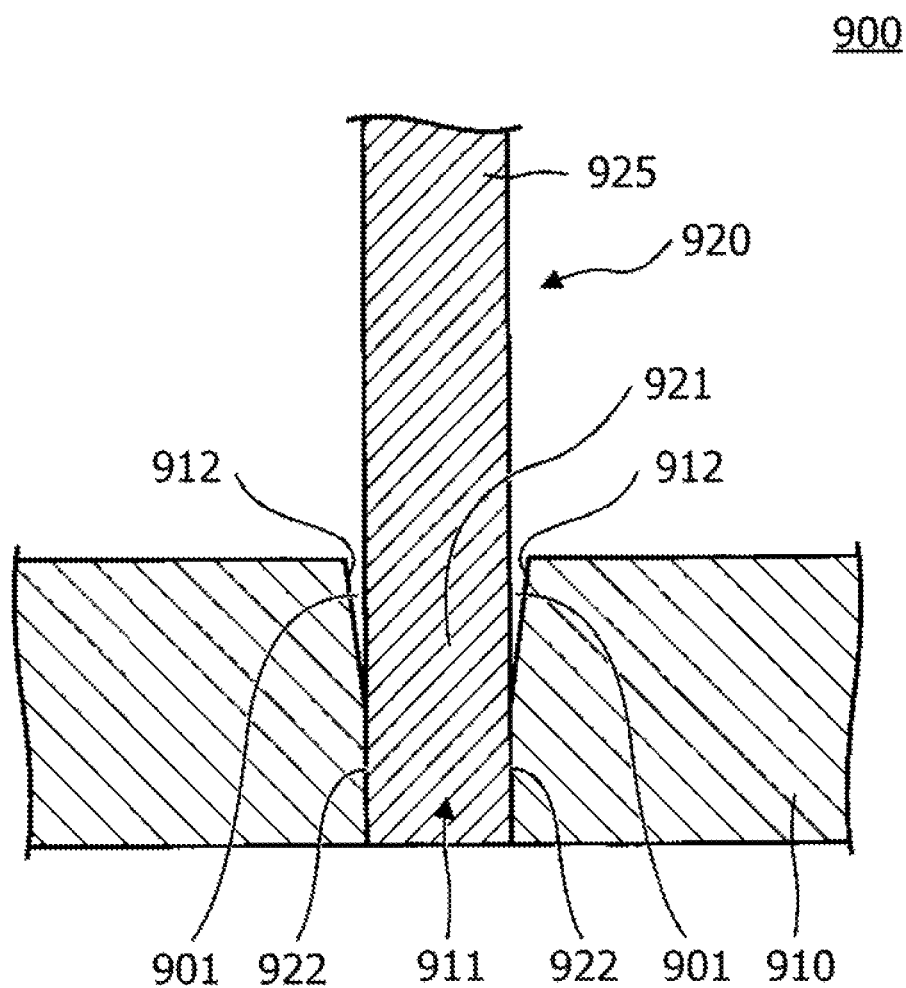
FIG. 1 is a sectional view illustrating part of a heat sink according to a reference example.

Intensive studies are made to clarify the reason why it is difficult to obtain sufficient heat dissipation performance with a heat sink in which fins are secured to grooves formed in a base plate by crimping. As a result, the following has been clarified. FIG. 1 is a sectional view illustrating part of a heat sink according to a reference example.

In a heat sink 900 according to the reference example, as illustrated in FIG. 1, a groove 911 is formed in a base plate 910, and a projection 921 projecting from a base portion 925 of a fin 920 is secured to the groove 911 by crimping. When the heat sink 900 is carefully observed, there are gaps 901 between side surfaces 922 of the projection 921 and inner wall surfaces 912 of the groove 911. When the projection 921 is secured in the groove 911 by crimping, formation of the gaps 901 is unavoidable. The gaps 901 inhibits heat transfer between the projection 921 and the base plate 910.

Hereinafter, embodiments will be described in detail with reference to accompanying drawings. In the specification and drawings, elements having substantially the same functional configuration may be denoted by the same reference signs and redundant description thereof may be omitted. In the present disclosure, an X1-X2 direction, a Y1-Y2 direction, and a Z1-Z2 direction are perpendicular to one another. Furthermore, a plane extending in the X1-X2 direction and the Y1-Y2 direction is referred to as an XY plane, a plane extending in the Y1-Y2 direction and the Z1-Z2 direction is referred to as a YZ plane, and a plane extending in the Z1-Z2 direction and the X1-X2 direction is referred to as a ZX plane. For convenience, the Z1-Z2 direction is assumed to be the vertical direction. In addition, according to the present disclosure, matching in dimension does not exclude, in an exact manner, a case where dimensions do not match due to variation in manufacturing. Dimensions varied due to the variation in manufacturing may be regarded as matching dimensions.

First Embodiment

Figure 2:
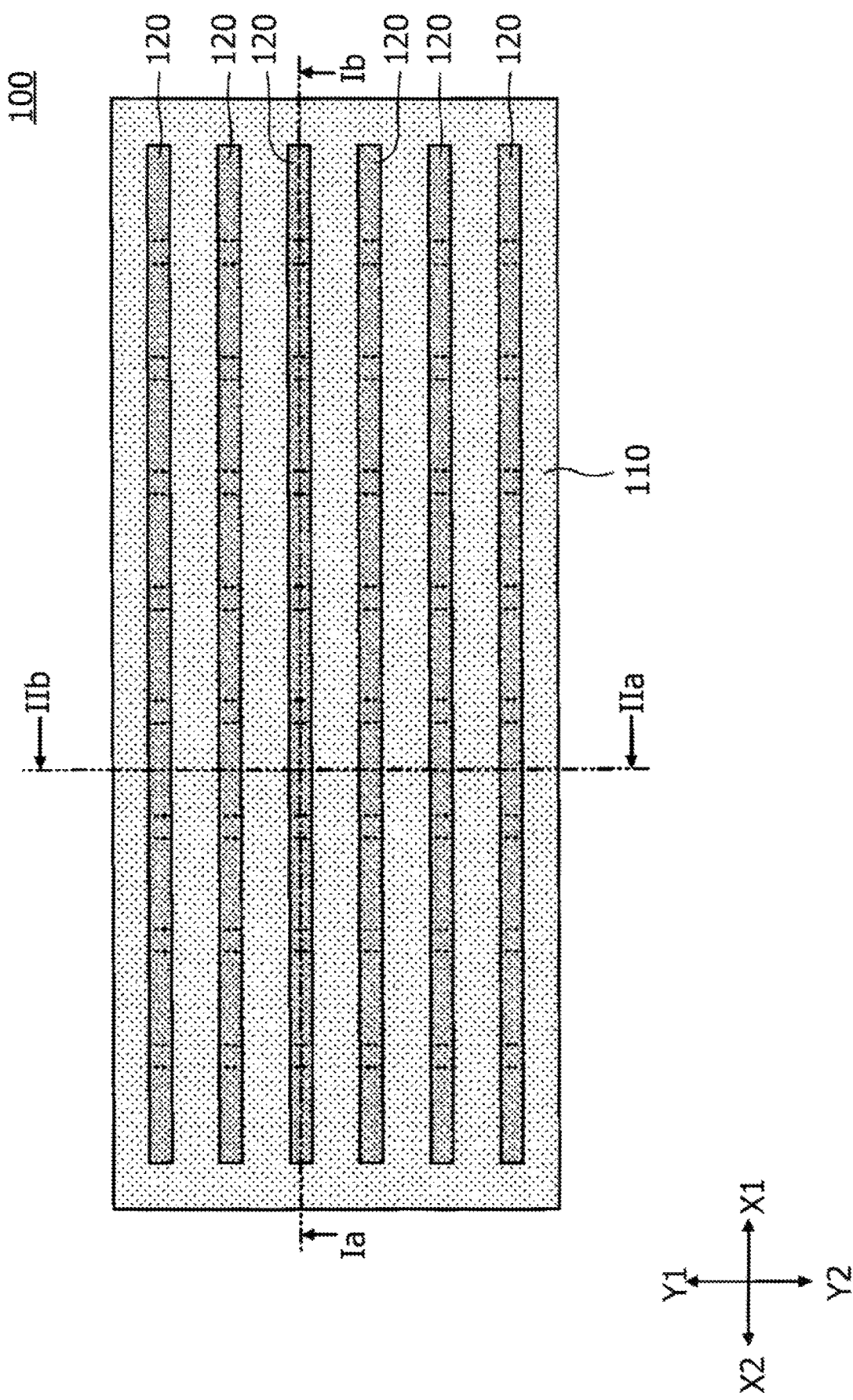
FIG. 2 is a top view illustrating a heat sink according to a first embodiment.
Figure 3:
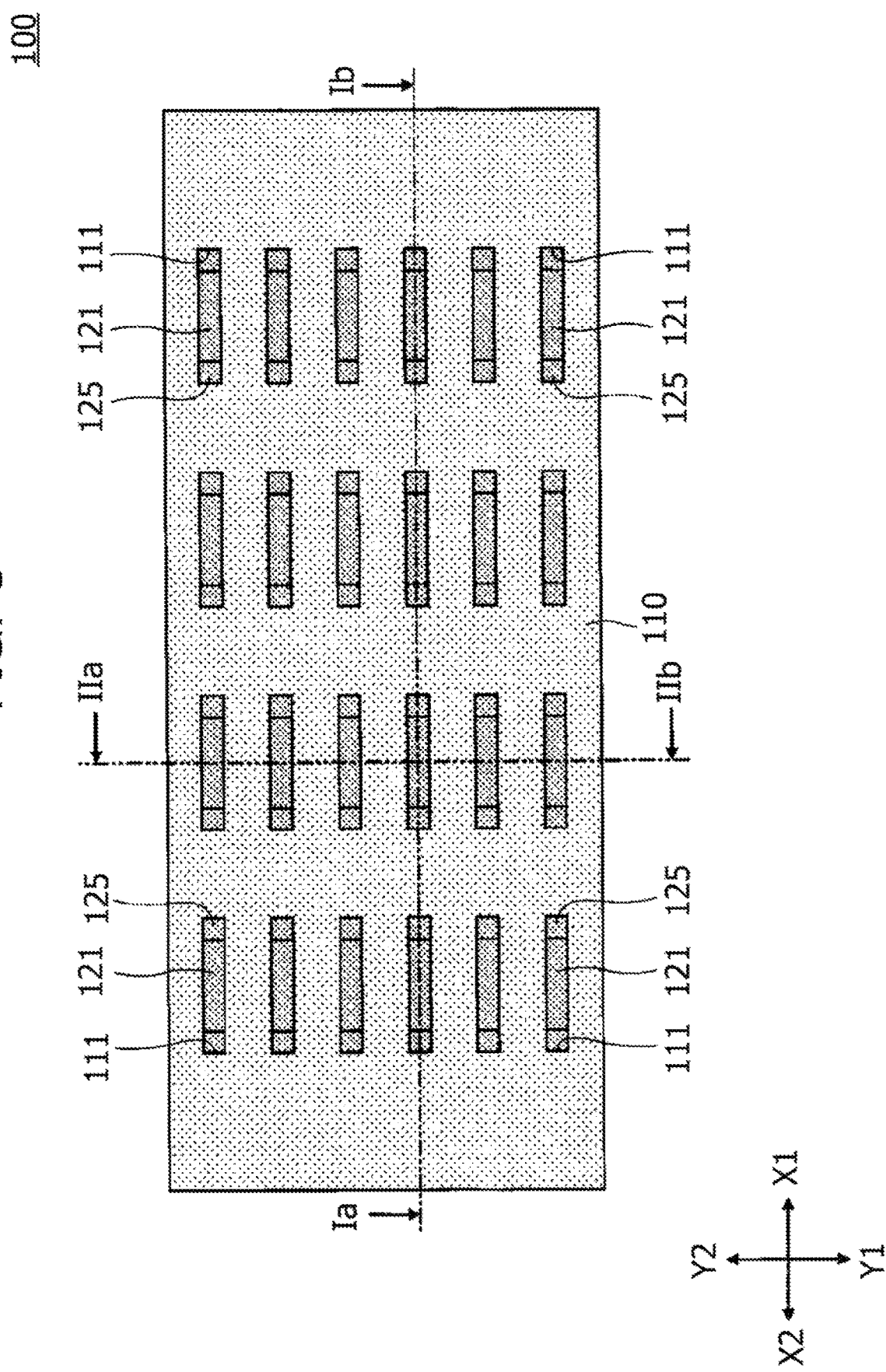
FIG. 3 is a bottom view illustrating the heat sink according to the first embodiment.
Figure 4:
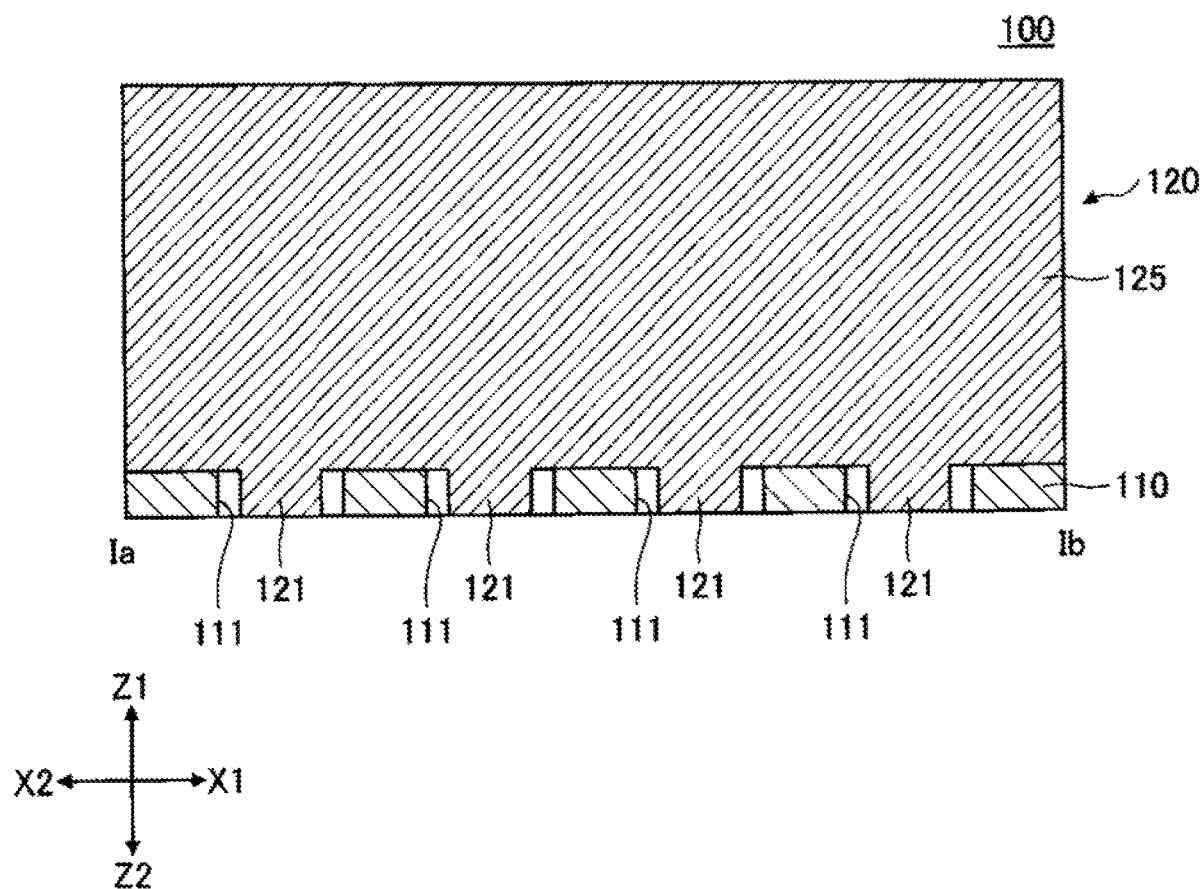
FIG. 4 is a sectional view (No. 1) illustrating the heat sink according to the first embodiment.
Figure 5:
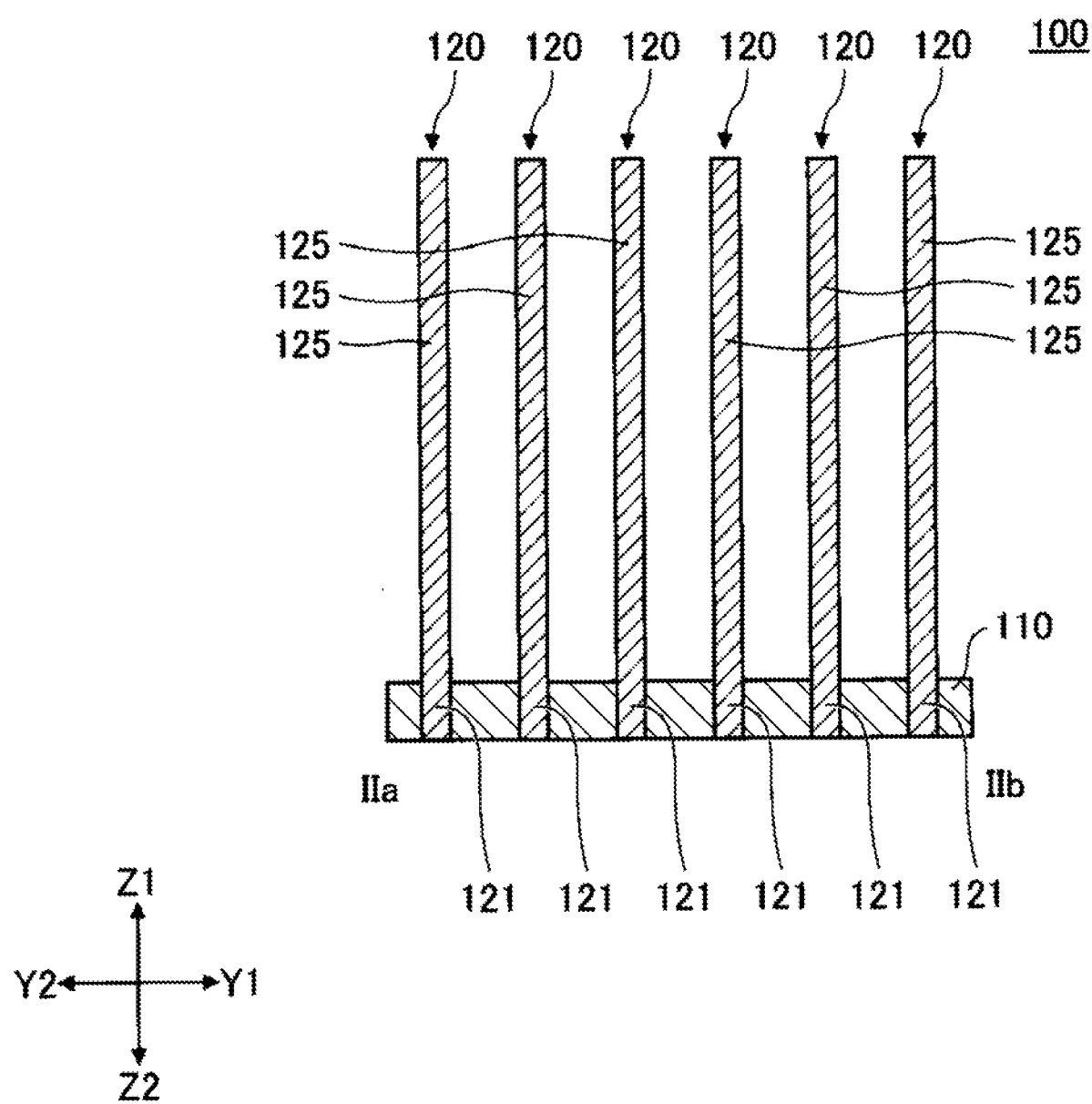
FIG. 5 is a sectional view (No. 2) illustrating the heat sink according to the first embodiment.
Figure 6:
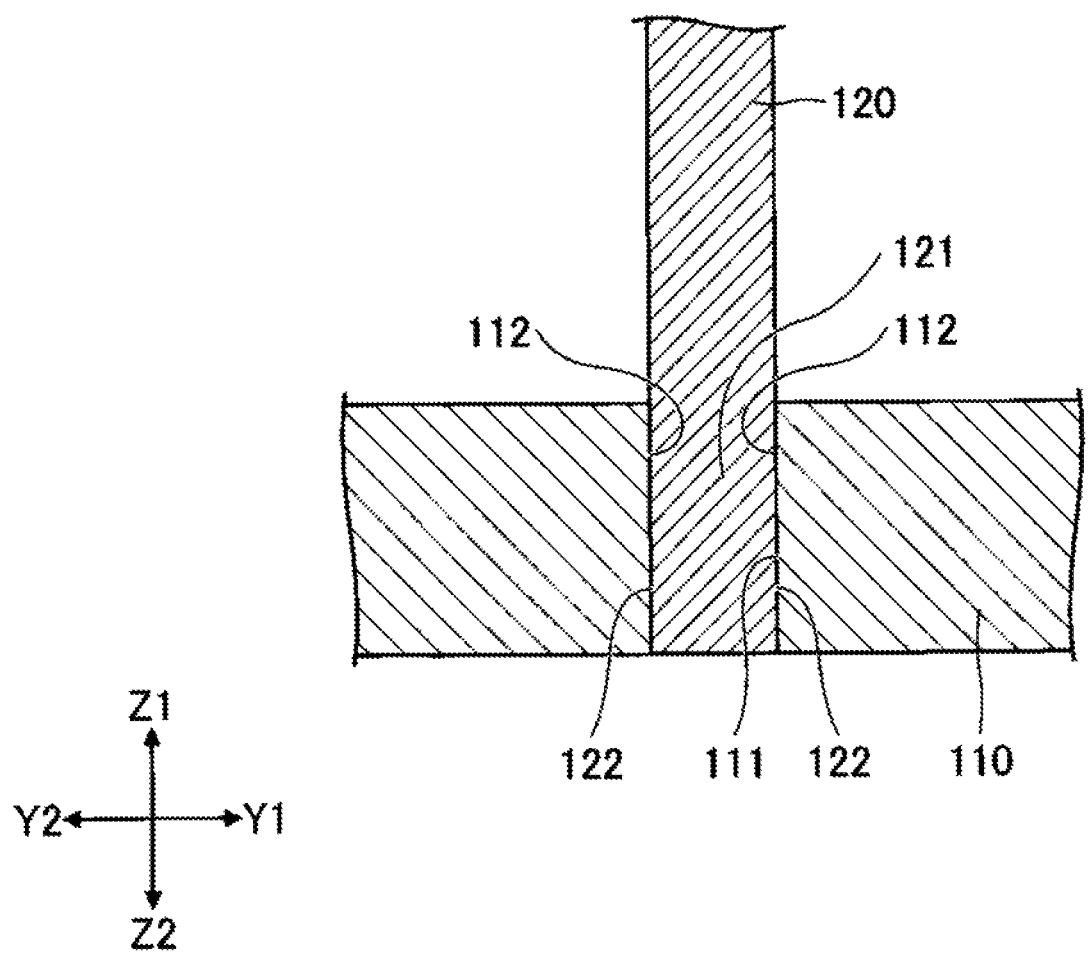
FIG. 6 is an enlarged sectional view of part of FIG. 5.

Initially, a first embodiment is described. The first embodiment is related to a heat sink. FIG. 2 is a top view illustrating the heat sink according to a first embodiment. FIG. 3 is a bottom view illustrating the heat sink according to the first embodiment. FIGS. 4 and 5 are sectional views illustrating the heat sink according to the first embodiment. FIG. 6 is an enlarged sectional view of part of FIG. 5. FIG. 4 corresponds to a sectional view taken along line Ia-Ib in FIGS. 2 and 3, and FIG. 5 corresponds to a section view taken along line IIa-IIb in FIGS. 2 and 3.

As illustrated in FIGS. 2 to 5, a heat sink 100 according to the first embodiment includes a base plate 110 and a plurality of fins 120 secured to the base plate 110. A plurality of through holes 111 extending in the X1-X2 direction parallel to the surface of the base plate 110 are formed in the base plate 110. Each of the fins 120 includes a base portion 125 and a projection 121 that projects from the base portion 125 and is inserted into a corresponding one of the through holes 111.

As illustrated in FIG. 6, in the Y1-Y2 direction parallel to the surface of the base plate 110 and perpendicular to the X1-X2 direction, both end surfaces 122 of the projection 121 are in contact with inner wall surfaces 112 of the through hole 111 entirely in the Z1-Z2 direction parallel to the thickness direction of the base plate 110.

In the heat sink 100 according to the first embodiment, in the Y1-Y2 direction, the end surfaces 122 of the projection 121 are in contact with the inner wall surfaces 112 of the through hole 111 entirely the Z1-Z2 direction. Thus, unlike the heat sink 900 according to the reference example, a good heat transmission property may be obtained between the projection 121 and the base plate 910. Accordingly, when the surface on the Z2 side of the base plate 110 is brought into contact with a heat-generating component, heat generated by the heat-generating component may be transmitted to the fin 120 with high efficiency, and good heat dissipation performance may be obtained.

The material of the base plate 110 or the fin 120 is not limited. The base plate 110 and the fin 120 may be formed of, for example, a metal material such as aluminum, an aluminum alloy, copper, or a copper alloy. Also, for example, the thickness of the base plate 110 is slightly larger than the thickness of the fins 120.

Next, a method of manufacturing the heat sink 100 according to the first embodiment is described. FIGS. 7 to 19 illustrate the method of manufacturing the heat sink 100 according to the first embodiment.

First, as illustrated in FIG. 7, a metal plate 105 is prepared. The base plate 110 and the fins 120 are to be cut out of the metal plate 105. The metal plate 105 is, for example, an aluminum plate, an aluminum alloy plate, a copper plate, or a copper alloy plate. The thickness t of the metal plate 105 is equal to the thickness of the fin 120. FIG. 7 is a perspective view illustrating the metal plate 105.

Figure 8:
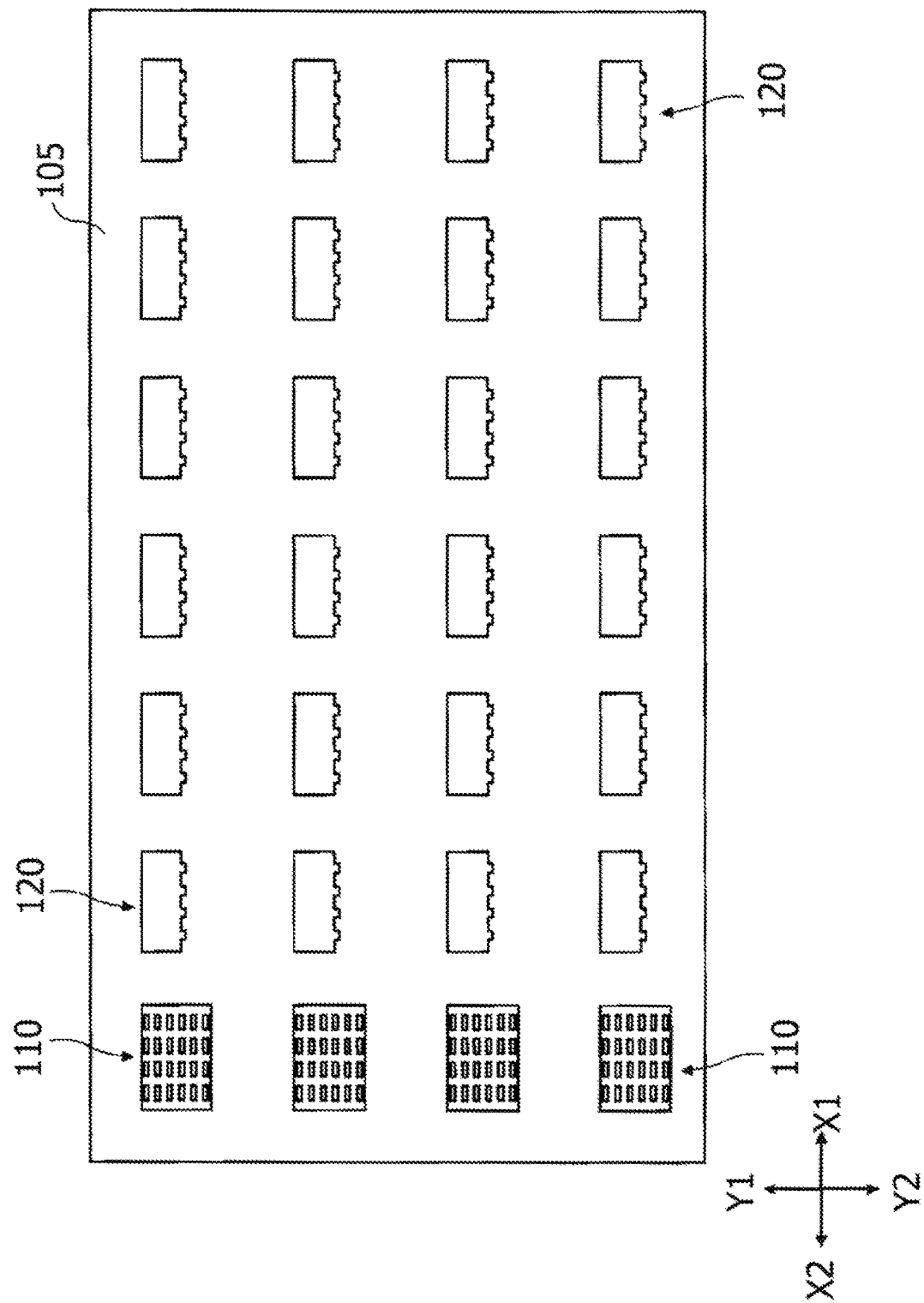
FIG. 8 is a diagram (No. 2) illustrating the method of manufacturing the heat sink according to the first embodiment.

Next, as illustrated in FIG. 8, a plurality of base plates 110 and the plurality of fins 120 are cut out of the metal plate 105. The base plates 110 and the fins 120 are able to be cut out by, for example, processing such as laser processing or pressing. FIG. 8 is a top view of the metal plate 105.

Figure 9:
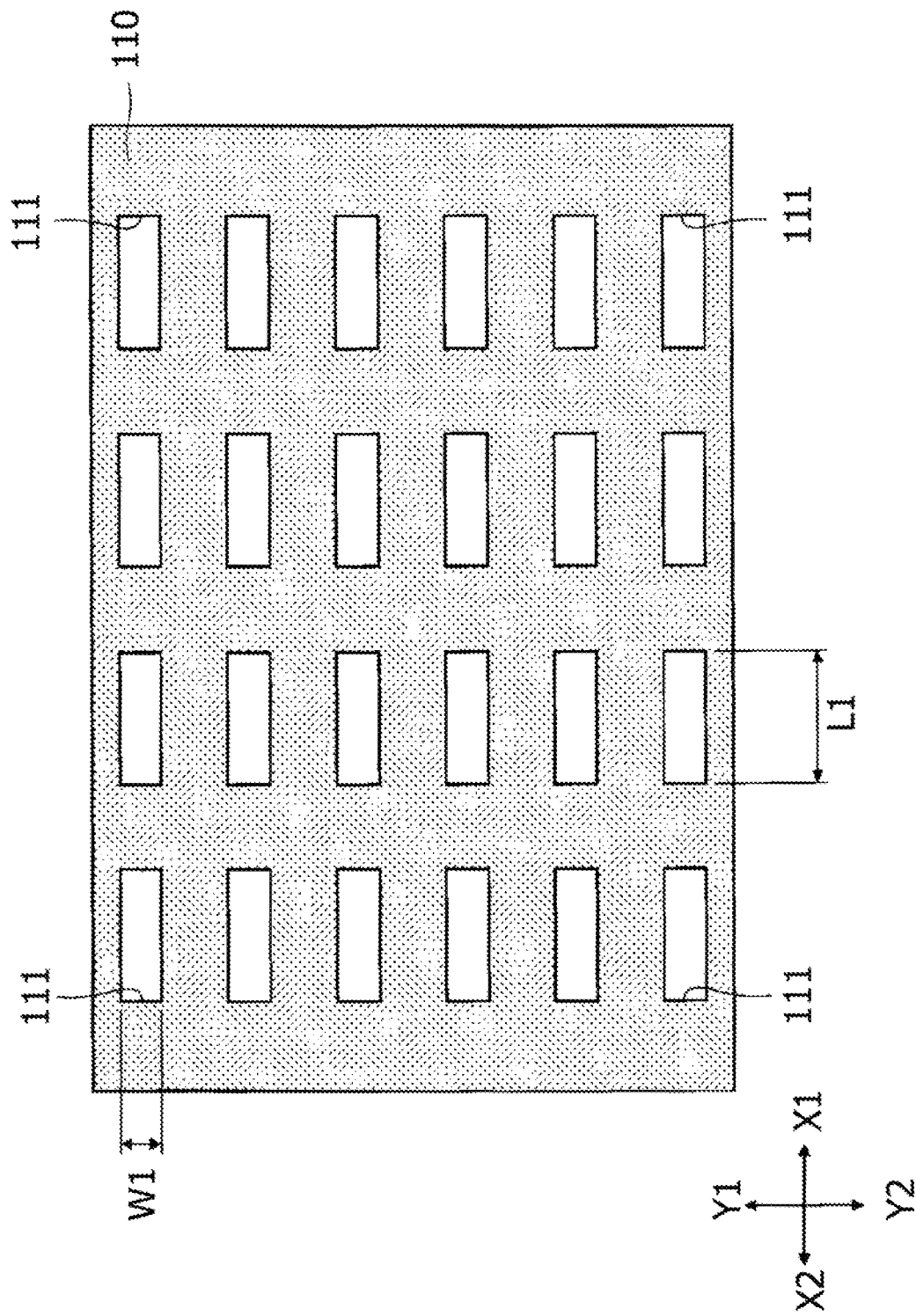
FIG. 9 is a diagram (No. 3) illustrating the method of manufacturing the heat sink according to the first embodiment.
Figure 10:
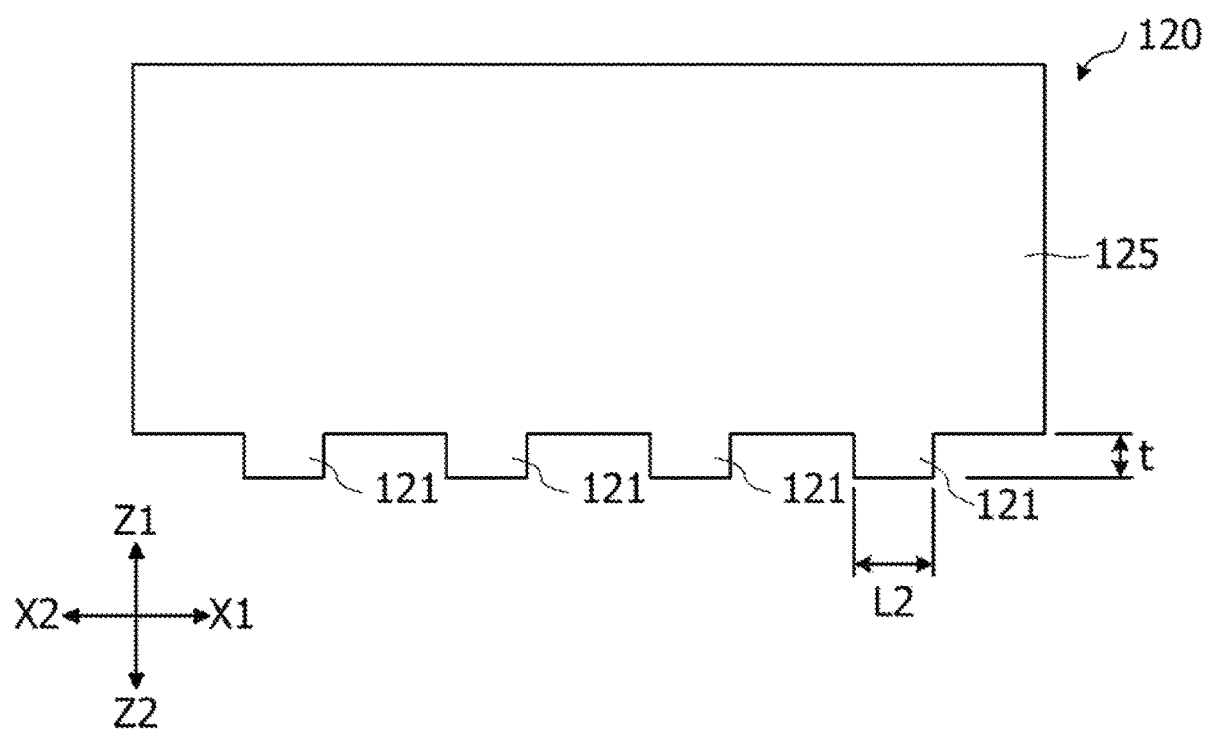
FIG. 10 is a diagram (No. 4) illustrating the method of manufacturing the heat sink according to the first embodiment.

As illustrated in FIG. 9, the plurality of through holes 111 are formed in the base plate 110 so as to be arranged in a rectangular array shape in the X1-X2 direction and the Y1-Y2 direction. As illustrated in FIG. 10, each of the fins 120 has the base portion 125 and a plurality of projections 121 projecting from the base portion 125 in the Z1-Z2 direction. The number of the projections 121 is equal to the number of the through holes 111 in the X1-X2 direction. For example, when seen from the Z1-Z2 direction, each of the through holes 111 has a substantially rectangular shape extending in the X1-X2 direction. The through hole 111 may have arcuate portions at each end in the X1-X2 direction. For example, when seen from the Z1-Z2 direction, the projection 121 has a substantially rectangular shape. A dimension L1 of the through hole 111 is larger than a dimension L2 of the projection 121 in the X1-X2 direction. A dimension W1 of the through hole 111 in the Y1-Y2 direction is larger than a thickness t of the fin 120. A projecting amount of each of the projections 121 is equal to the thickness t of the base plate 110. FIG. 9 is a top view of the base plate 110 cut out of the metal plate 105 according to the first embodiment. FIG. 10 is a front view of the fin 120 cut out of the metal plate 105.

Figure 11:
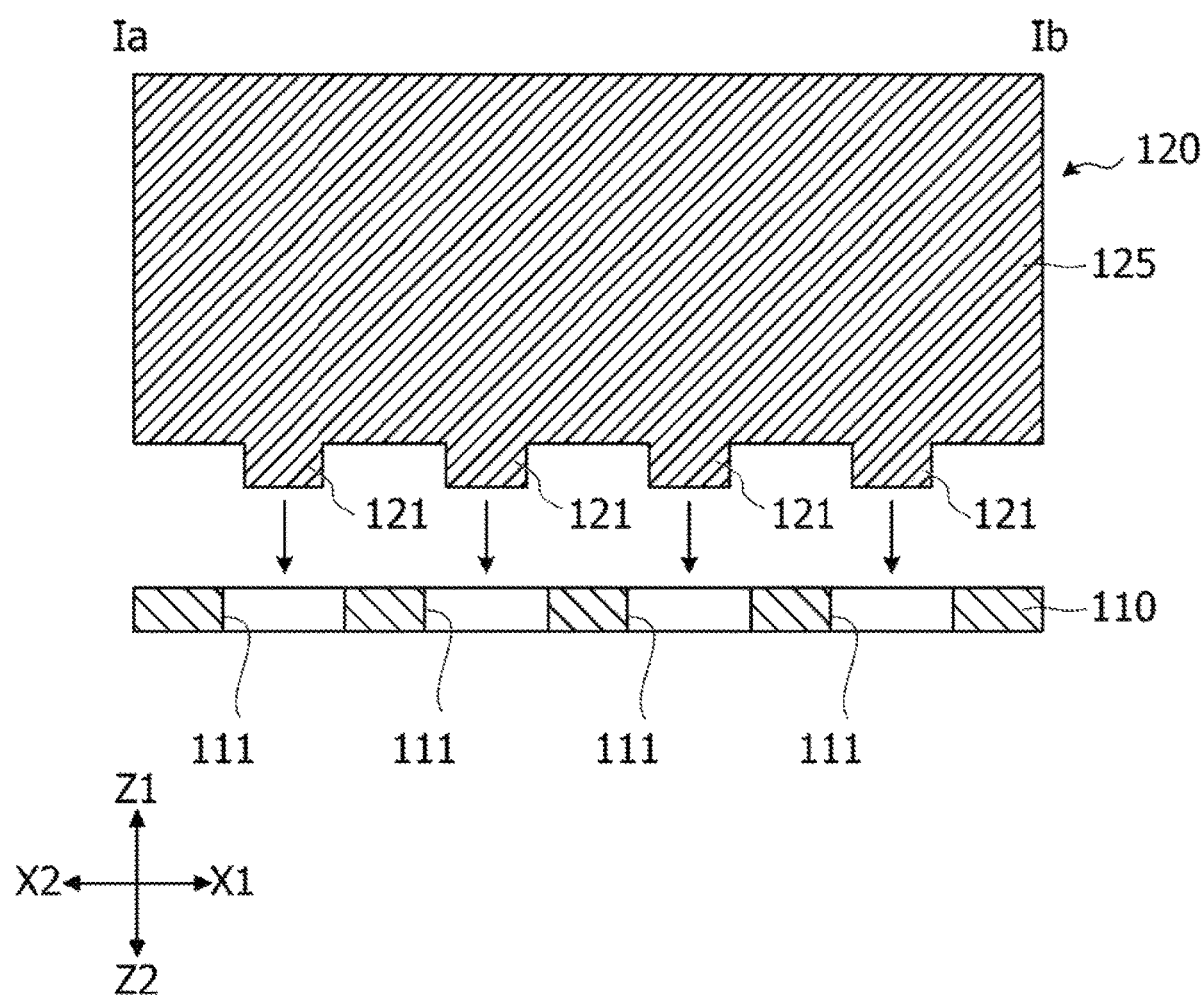
FIG. 11 is a diagram (No. 5) illustrating the method of manufacturing the heat sink according to the first embodiment.
Figure 12:
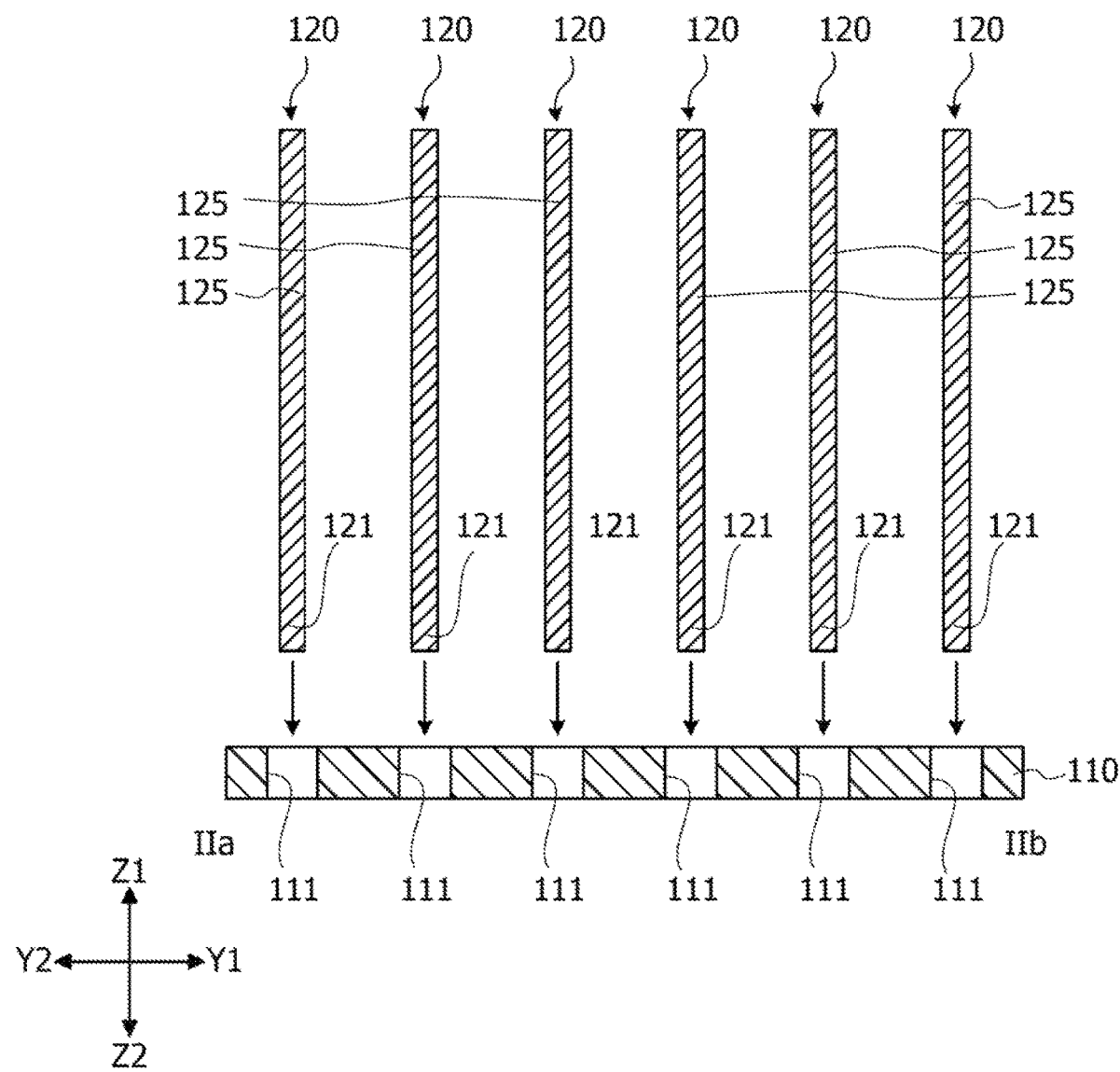
FIG. 12 is a diagram (No. 6) illustrating the method of manufacturing the heat sink according to the first embodiment.

Then, as illustrated in FIGS. 11 and 12, temporary assembly is performed by inserting the projections 121 of the fins 120 into the respective through holes 111 of the base plate 110. FIGS. 11 and 12 are sectional views illustrating the temporary assembly. FIG. 11 corresponds to a sectional view taken along line Ia-Ib in FIGS. 2 and 3, and FIG. 12 corresponds to a section view taken along line IIa-IIb in FIGS. 2 and 3.

Figure 13:
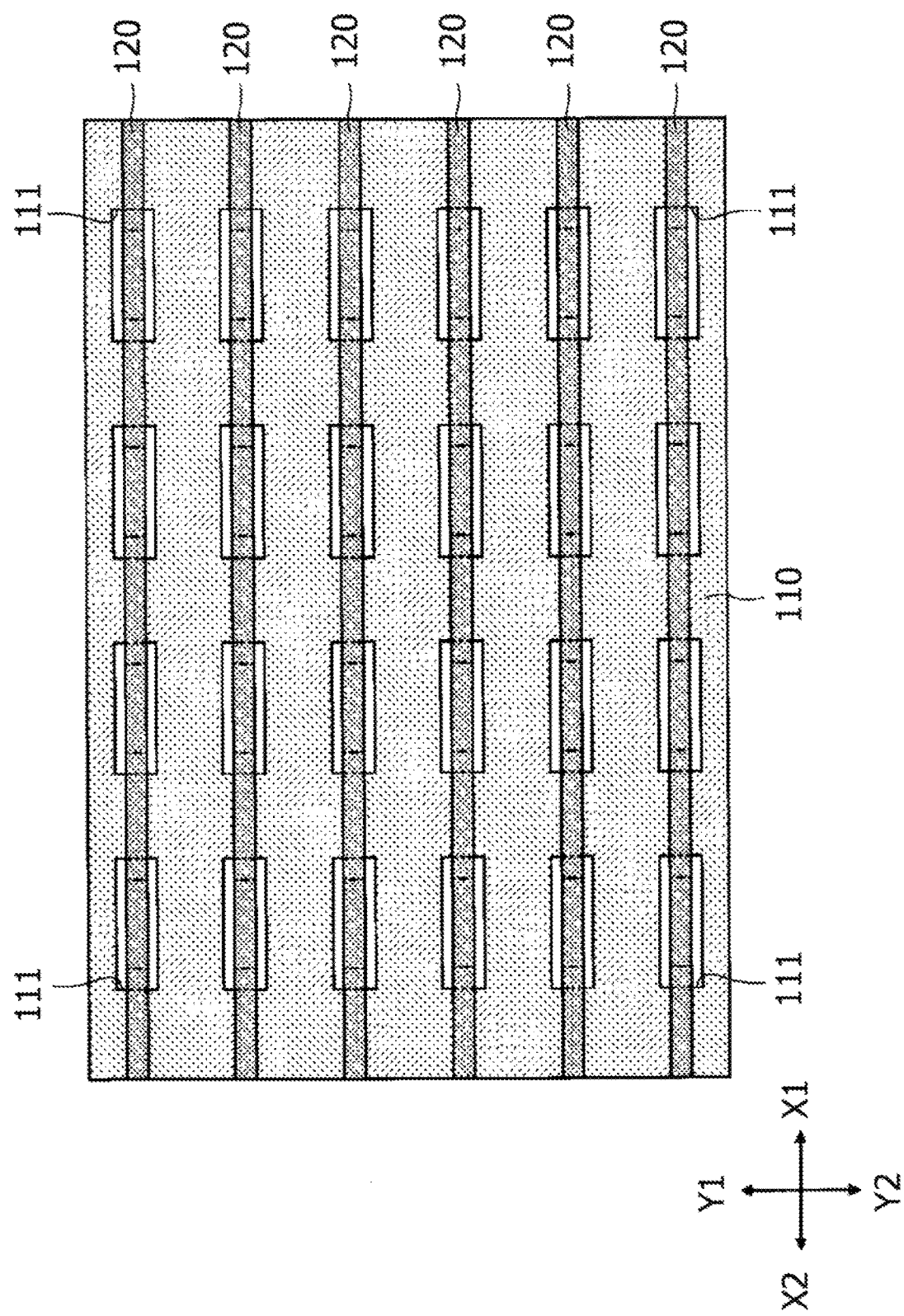
FIG. 13 is a diagram (No. 7) illustrating the method of manufacturing the heat sink according to the first embodiment.
Figure 14:
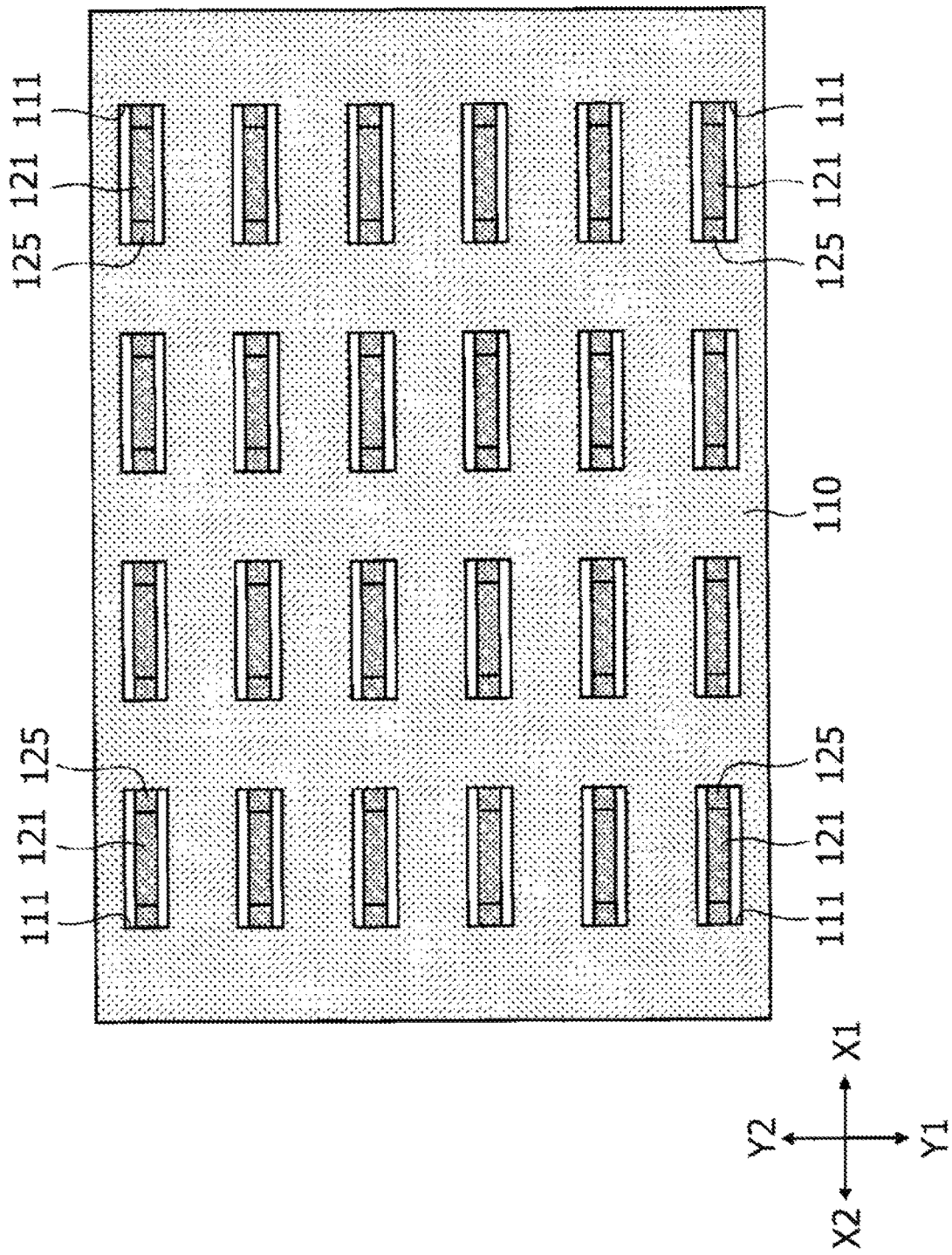
FIG. 14 is a diagram (No. 8) illustrating the method of manufacturing the heat sink according to the first embodiment.
Figure 15:
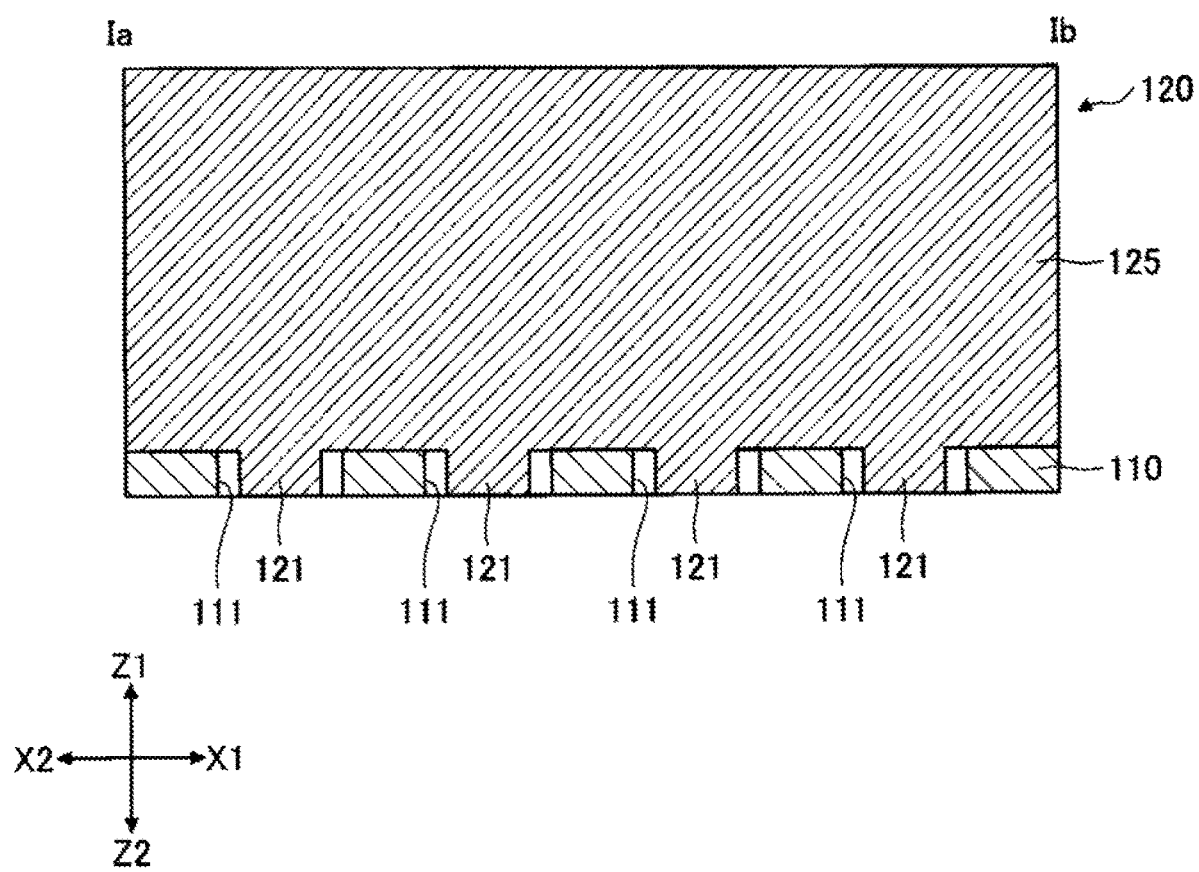
FIG. 15 is a diagram (No. 9) illustrating the method of manufacturing the heat sink according to the first embodiment.
Figure 16:
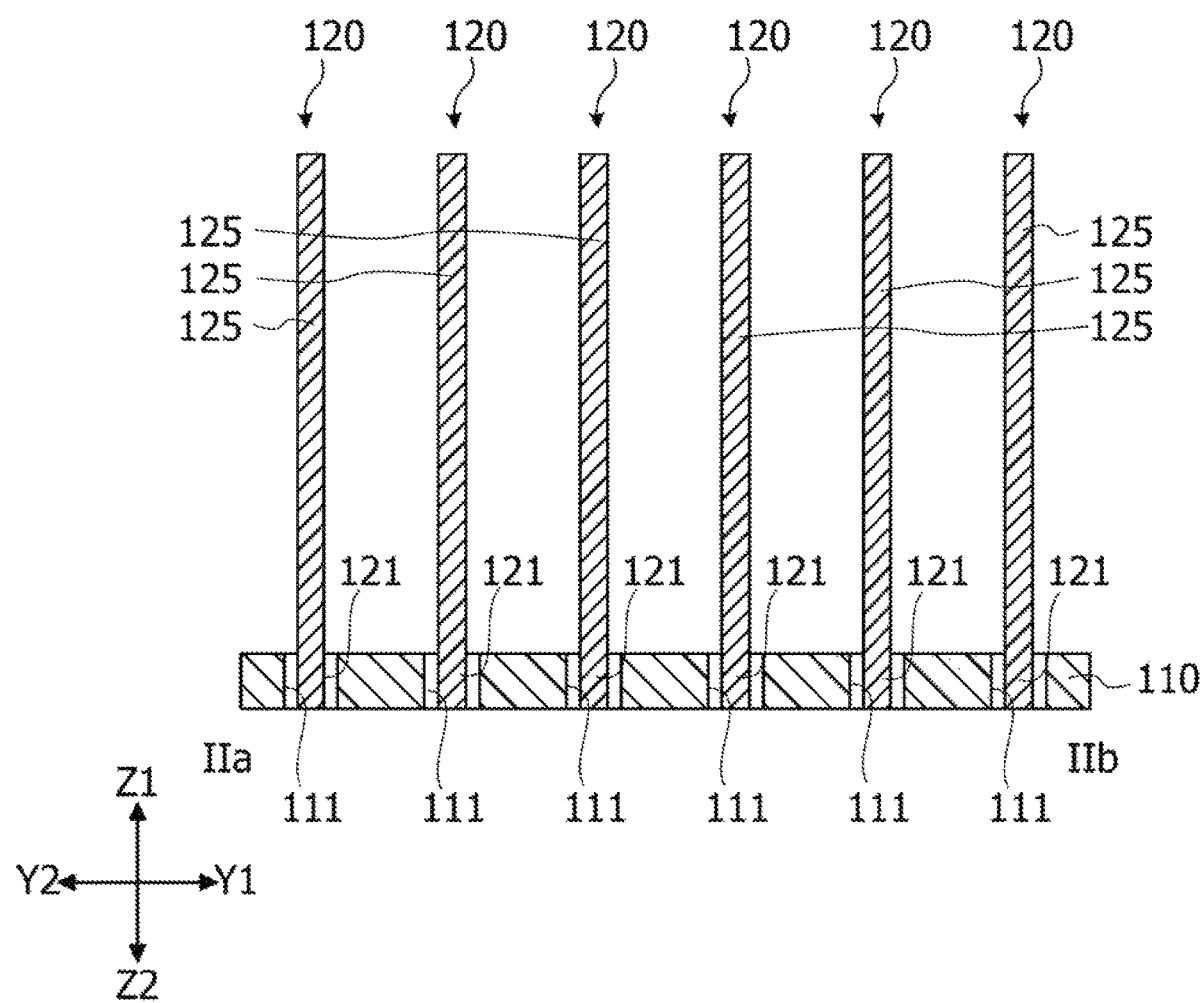
FIG. 16 is a diagram (No. 10) illustrating the method of manufacturing the heat sink according to the first embodiment.

The dimension L1 of the through holes 111 is larger than the dimension L2 of the projections 121 in the X1-X2 direction, and the dimension W1 of the through holes 111 in the Y1-Y2 direction is larger than the thickness t of the fins 120. Thus, as illustrated in FIGS. 13 to 16, gaps are formed between the projections 121 and the through holes 111. FIG. 13 is a top view illustrating the base plate 110 and the fins 120 after the temporary assembly. FIG. 14 is a bottom view illustrating the base plate 110 and the fins 120 after the temporary assembly according to the first embodiment. FIGS. 15 and 16 are sectional views illustrating the base plate 110 and the fins 120 after the temporary assembly. FIG. 15 corresponds to a sectional view taken along line Ia-Ib in FIGS. 2 and 3, and FIG. 16 corresponds to a section view taken along line IIa-IIb in FIGS. 2 and 3.

Figure 17:
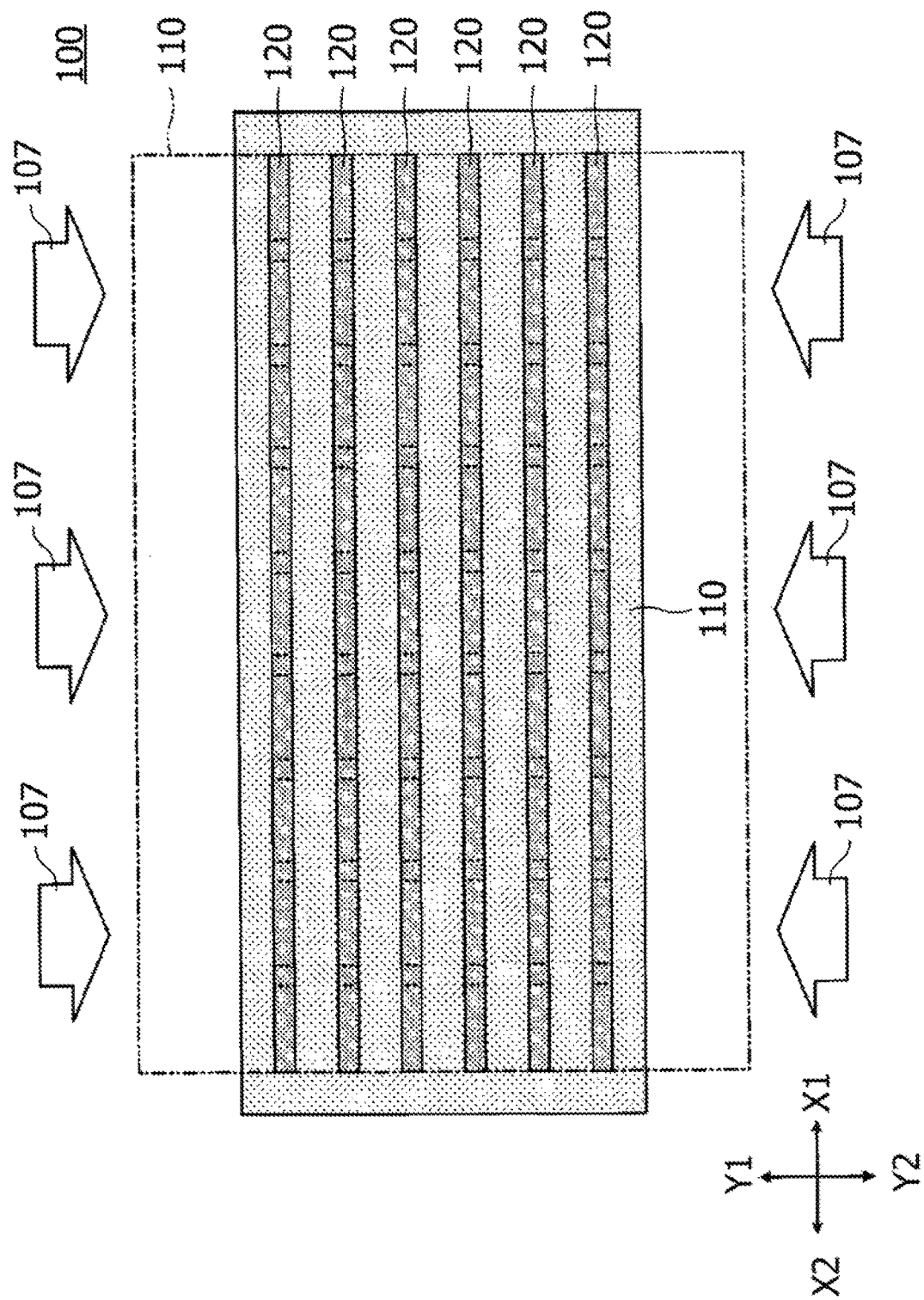
FIG. 17 is a diagram (No. 11) illustrating the method of manufacturing the heat sink according to the first embodiment.
Figure 18:
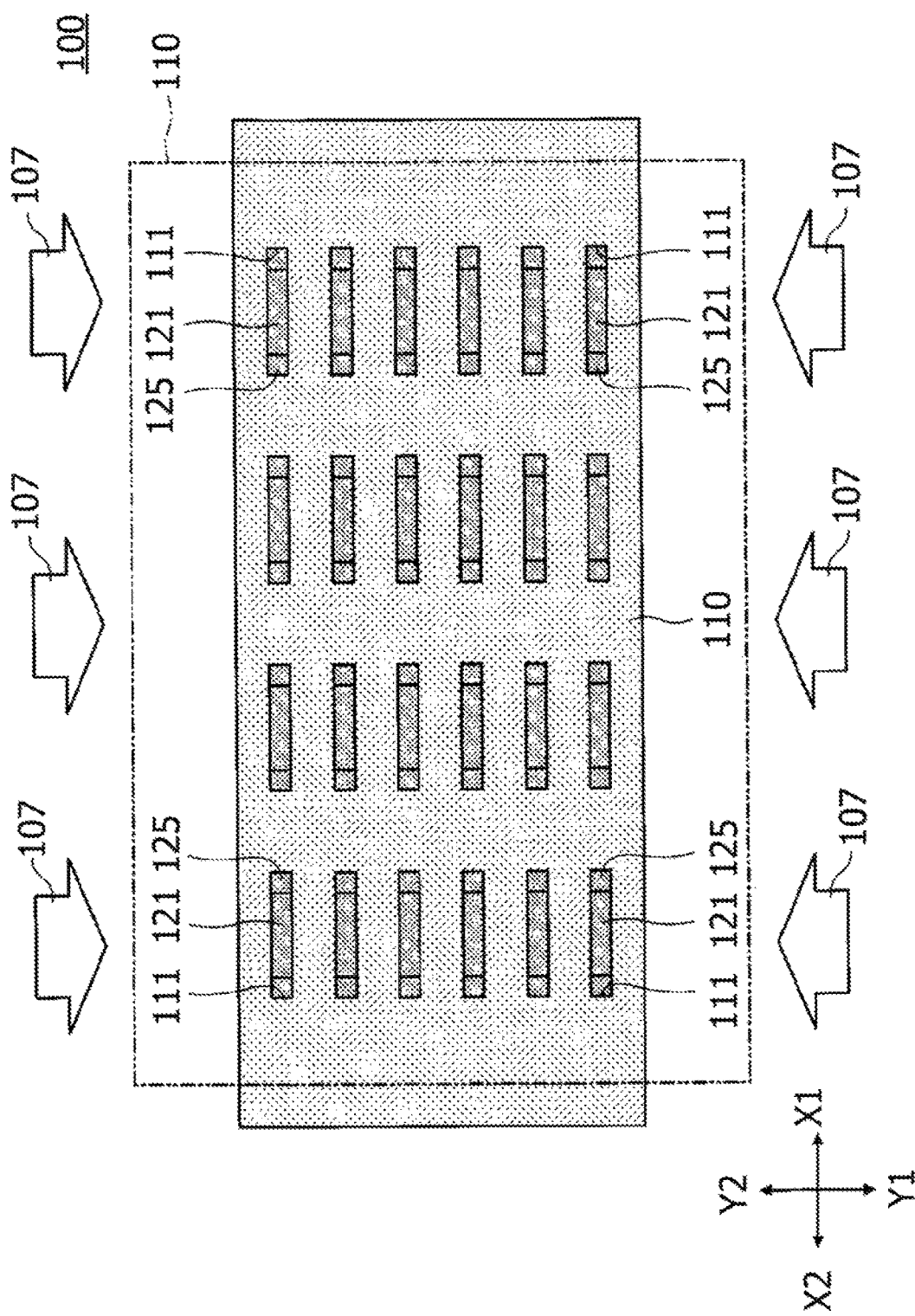
FIG. 18 is a diagram (No. 12) illustrating the method of manufacturing the heat sink according to the first embodiment.
Figure 19:
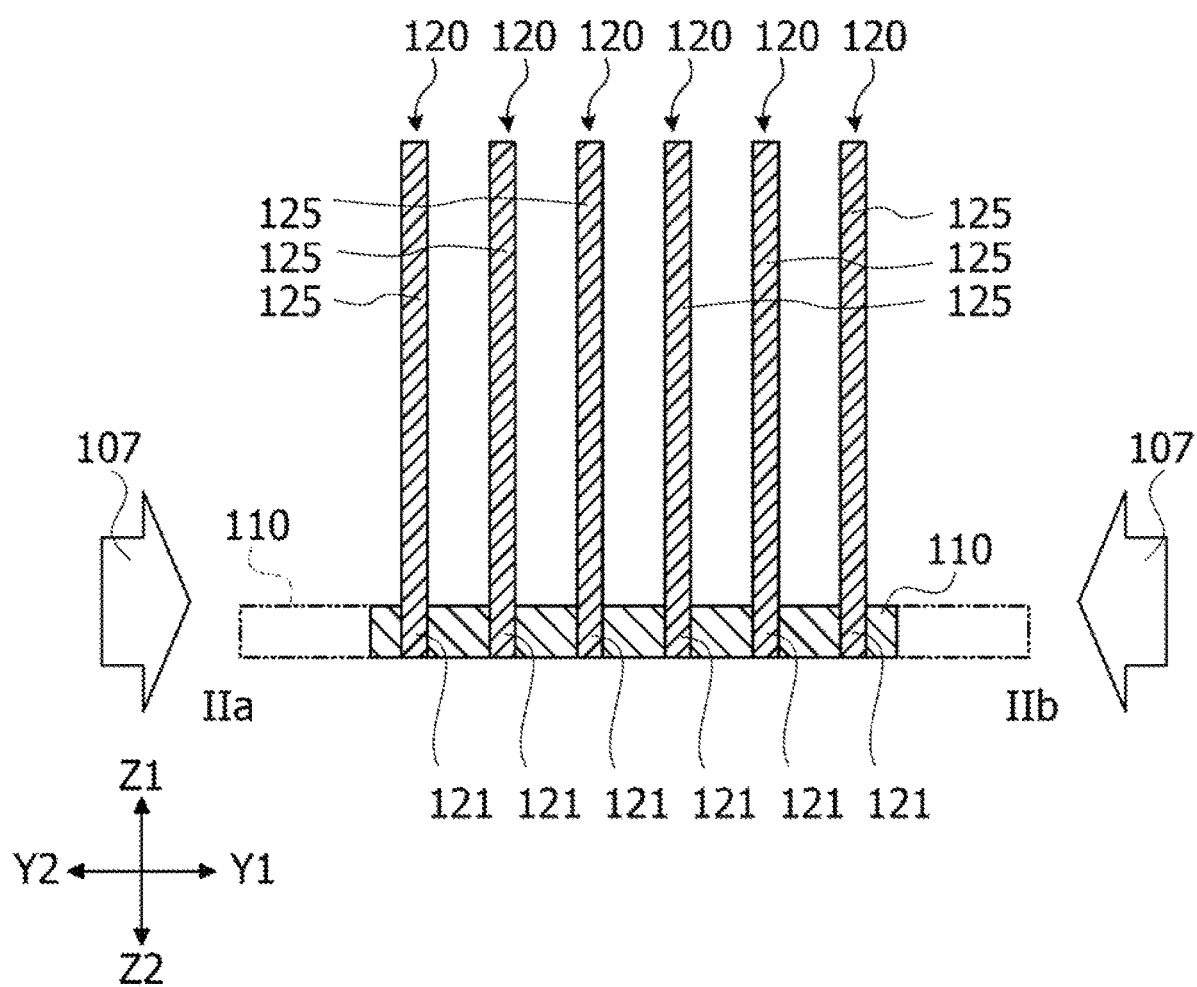
FIG. 19 is a diagram (No. 13) illustrating the method of manufacturing the heat sink according to the first embodiment.

Next, as illustrated in FIGS. 17 to 19, compressive loads 107 are applied to the base plate 110 in the Y1-Y2 direction while the temporary assembly state is maintained. As a result, the through holes 111 are flattened in the Y1-Y2 direction, and the end surfaces 122 of the projections 121 are, in the Y1-Y2 direction, brought into contact with and brought into intimate contact with the inner wall surfaces 112 of the through holes 111 entirely in the Z1-Z2 direction (see FIG. 6). Thus, the fins 120 are secured to the base plate 110. FIG. 17 is a top view illustrating the base plate 110 and the fins 120 after the fins 120 have been secured to the base plate 110. FIG. 18 is a bottom view illustrating the base plate 110 and the fins 120 after the fins 120 have been secured to the base plate 110. FIG. 19 is a sectional view illustrating the base plate 110 and the fins 120 after the fins 120 have been secured to the base plate 110. FIG. 19 corresponds to a sectional view taken along line IIa-IIb in FIGS. 2 and 3.

In this way, the heat sink 100 according to the first embodiment is able to be manufactured.

With this method, intimate contact between the base plate 110 and the fins 120 may be obtained. Thus, heat transfer properties equivalent to those obtained by extrusion or cold forging may be obtained by a simple method. When the projections 121 are able to be secured in the through holes 111, the versatility in designing the planar shape of the fins 120 may be high. Accordingly, the heat sink 100 producing higher heat dissipation performance may be realized by, for example, increasing the surface area.

Furthermore, when the through holes 111 of the base plate 110 are formed by pressing, tapered surfaces may be formed at end portions of the through holes 111. However, with this method of manufacturing, the tapered surfaces are also able to be brought into intimate contact with the end surfaces 122 of the projections 121 by the application of the compressive loads 107.

The base plate 110 may be prepared in a different metal plate than a metal plate in which the fins 120 are prepared.

Second Embodiment

Figure 20:
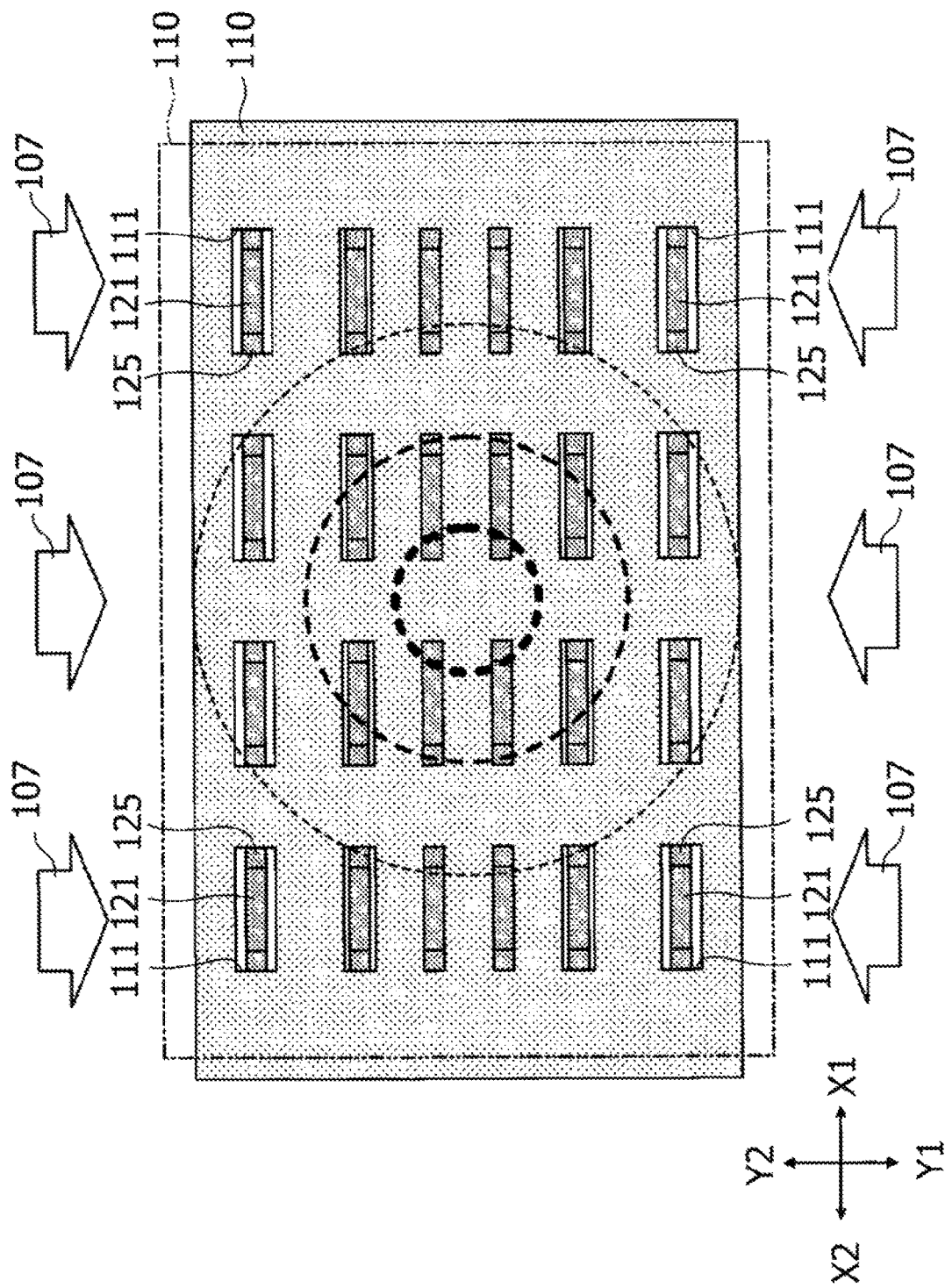
FIG. 20 is a bottom view schematically illustrating a distribution of stress acting on a base plate when compressive loads are applied according to the first embodiment.
Figure 21:
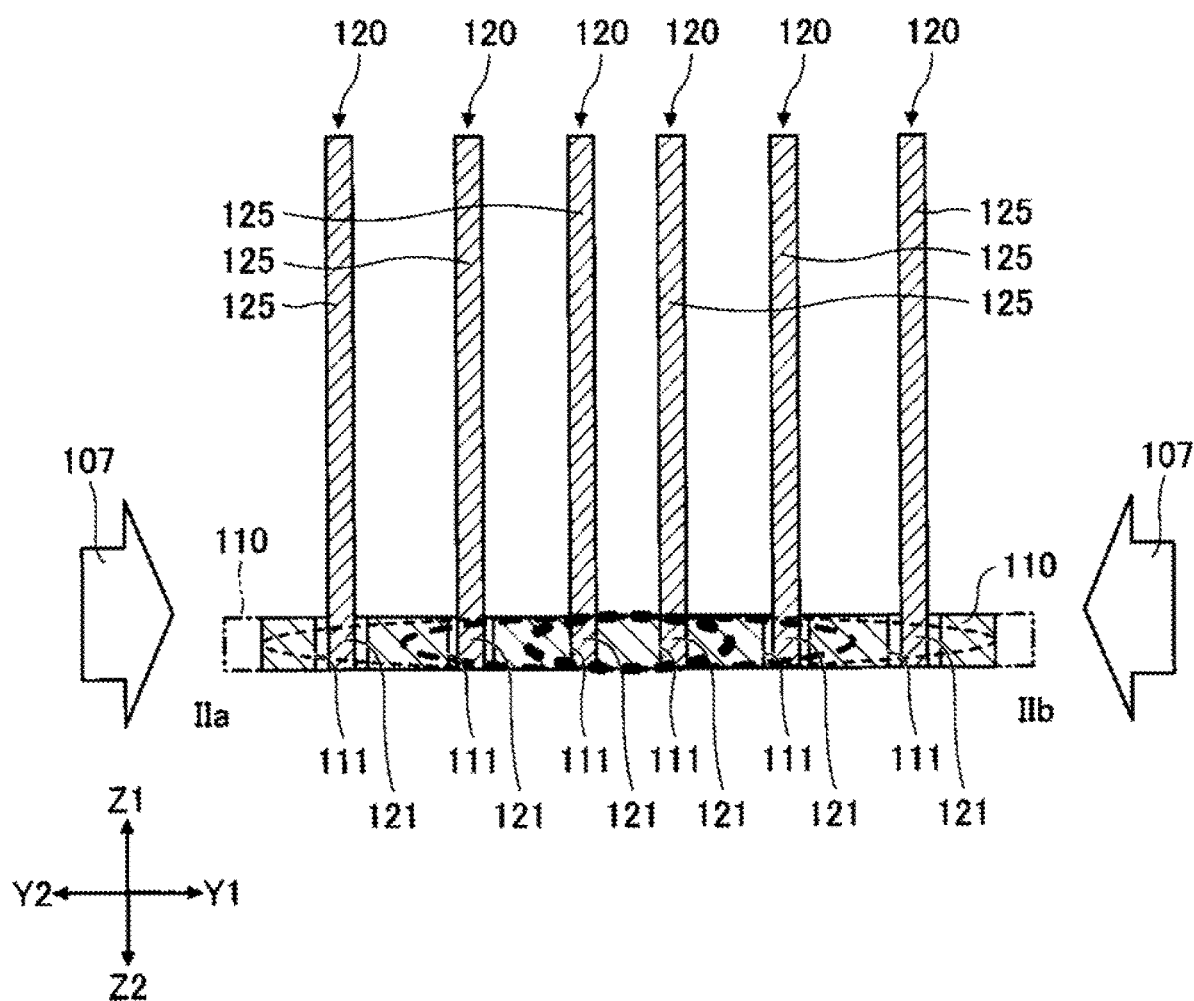
FIG. 21 is a sectional view schematically illustrating the distribution of stress acting on the base plate when the compressive loads are applied according to the first embodiment.

Next, a second embodiment is described. The second embodiment differs from the first embodiment in the shape of the base plate 110 before the application of the compressive loads 107. FIGS. 20 and 21 schematically illustrate a distribution of stress acting on the base plate 110 when the compressive loads 107 are applied according to the first embodiment. FIG. 20 is a bottom view, and FIG. 21 is a sectional view. Three types of dashed line circles in FIG. 20 and FIG. 21 schematically illustrate the distribution of stress. The thicker a dashed line is, the larger the stress is.

Figure 22:
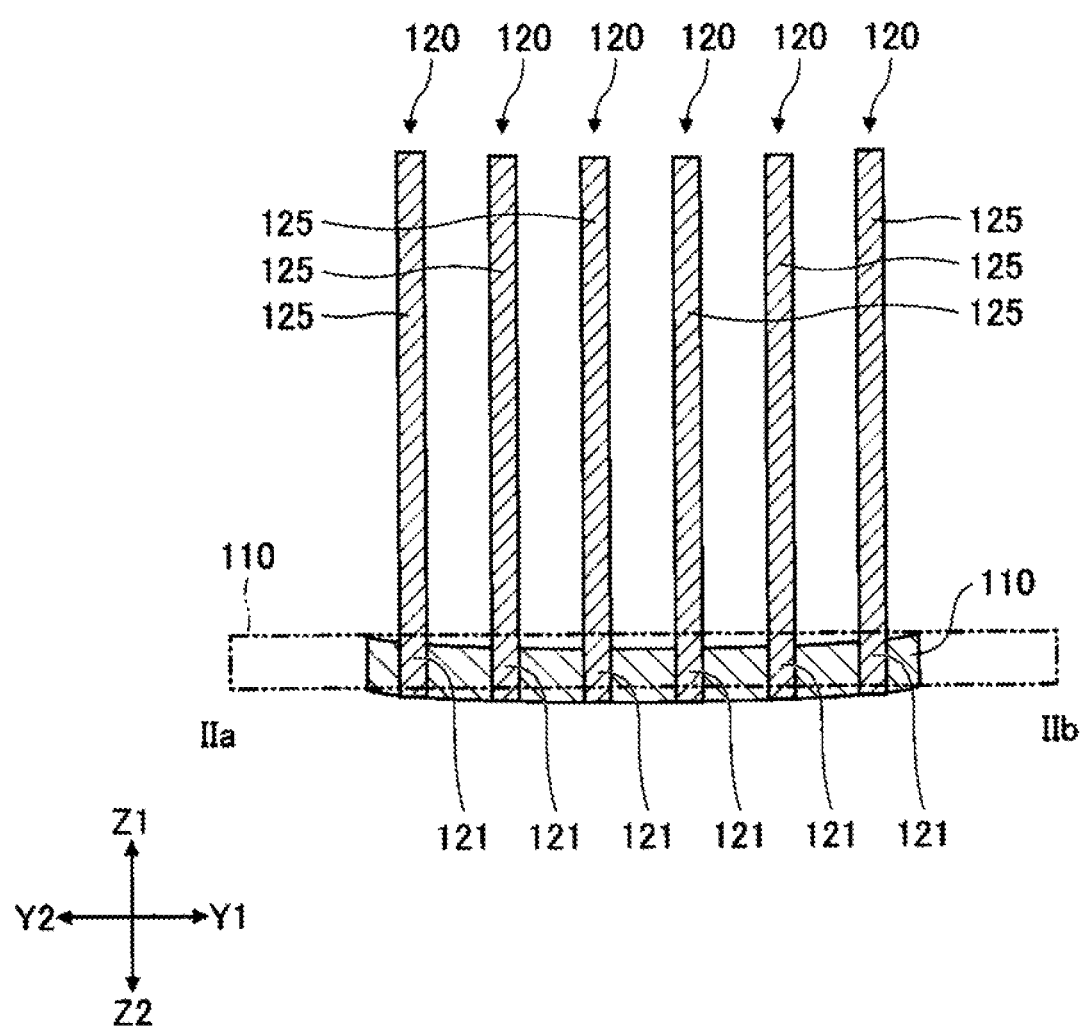
FIG. 22 is a sectional view illustrating bending of the base plate.

As illustrated in FIGS. 20 and 21, when the compressive load 107 is applied to the base plate 110, the stress acting on the base plate 110 becomes larger as the distance from the center reduces in the X1-X2 direction or the Y1-Y2 direction. Thus, as illustrated in FIGS. 20 and 21, in the Y1-Y2 direction, the through holes 111 are flattened earlier as the distance from the center reduces and later as the distance from the center increases in the Y1-Y2 direction. Accordingly, when the through holes 111 at the ends in the Y1-Y2 direction are flattened, excessive stress acts on the center in the Y1-Y2 direction. Thus, in some cases the base plate 110 is not only subjected to compressive deformation in the Y1-Y2 direction but also, as illustrated in FIG. 22, bent in the Z1-Z2 direction. FIG. 22 is a sectional view illustrating bending of the base plate 110.

When the base plate 110 is bent in the Z1-Z2 direction, a gap is likely to be formed between the surface of the base plate 110 on the Z2 side and the heat-generating component. A thermal interface material (TIM) may be provided between the base plate 110 and the heat-generating component. However, even with the TIM, the thermal conductivity reduces due to the gap.

Figure 23:
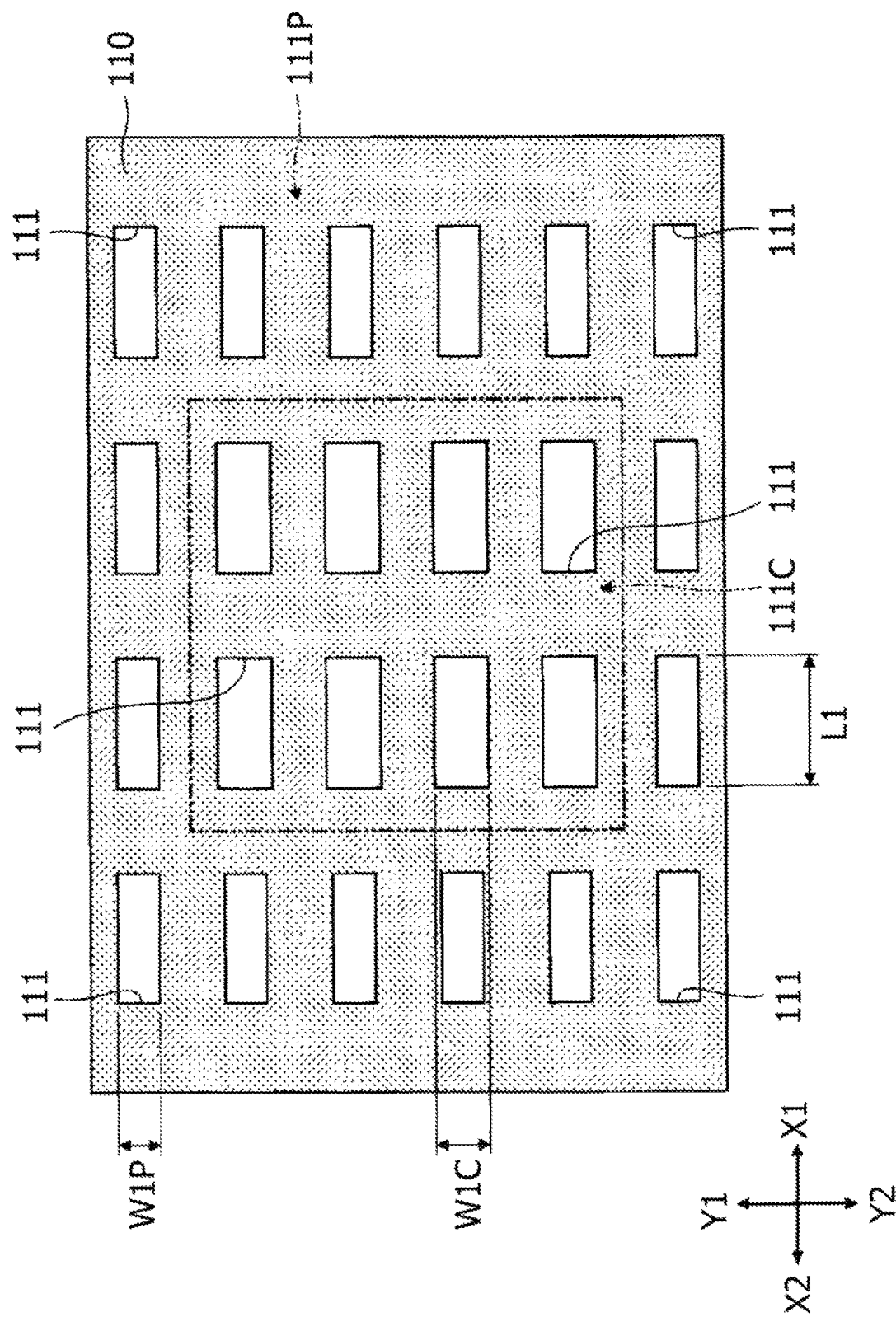
FIG. 23 is a diagram (No. 1) illustrating a method of manufacturing a heat sink according to a second embodiment.
Figure 24:
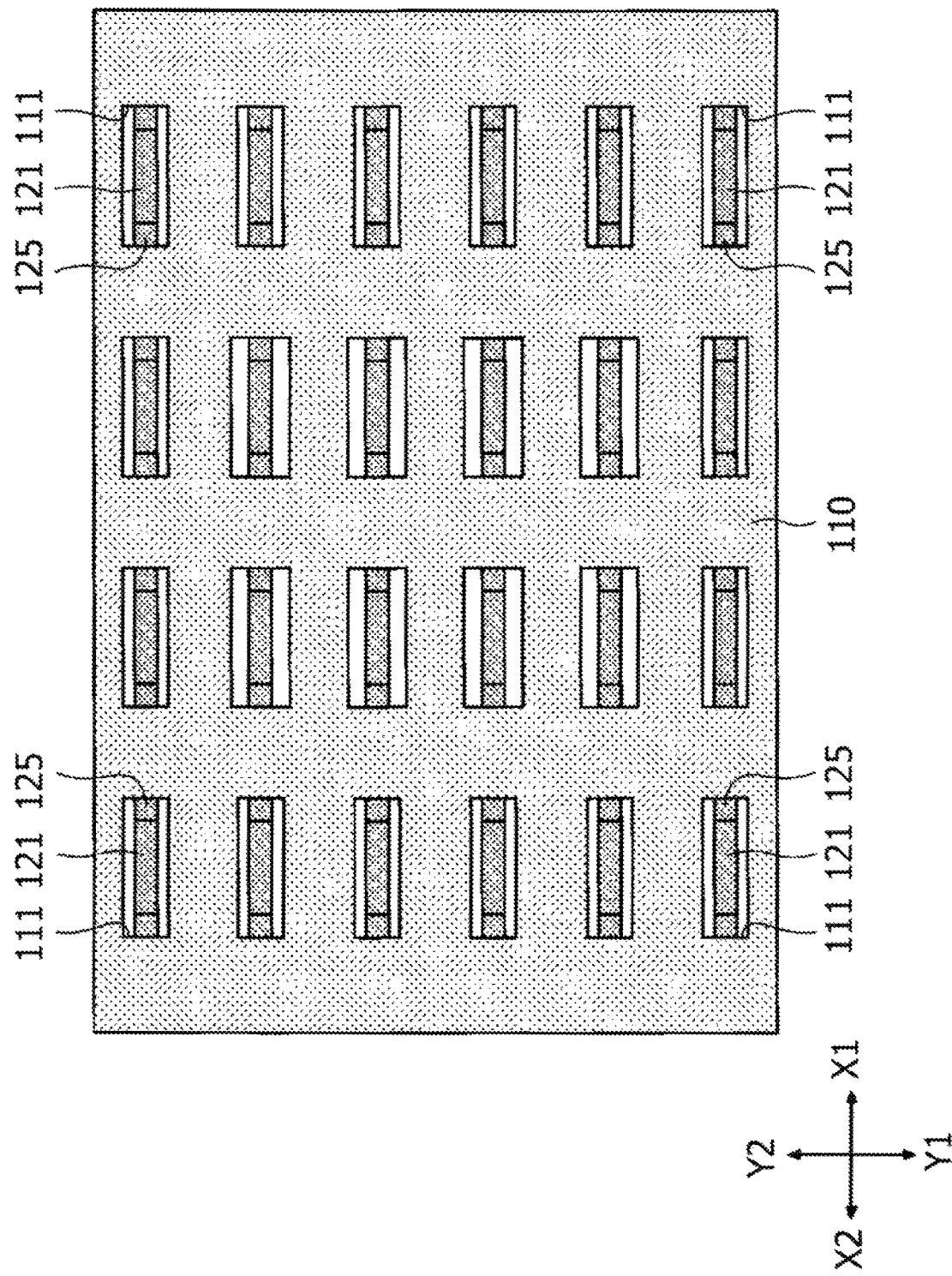
FIG. 24 is a diagram (No. 2) illustrating the method of manufacturing the heat sink according to the second embodiment.
Figure 25:
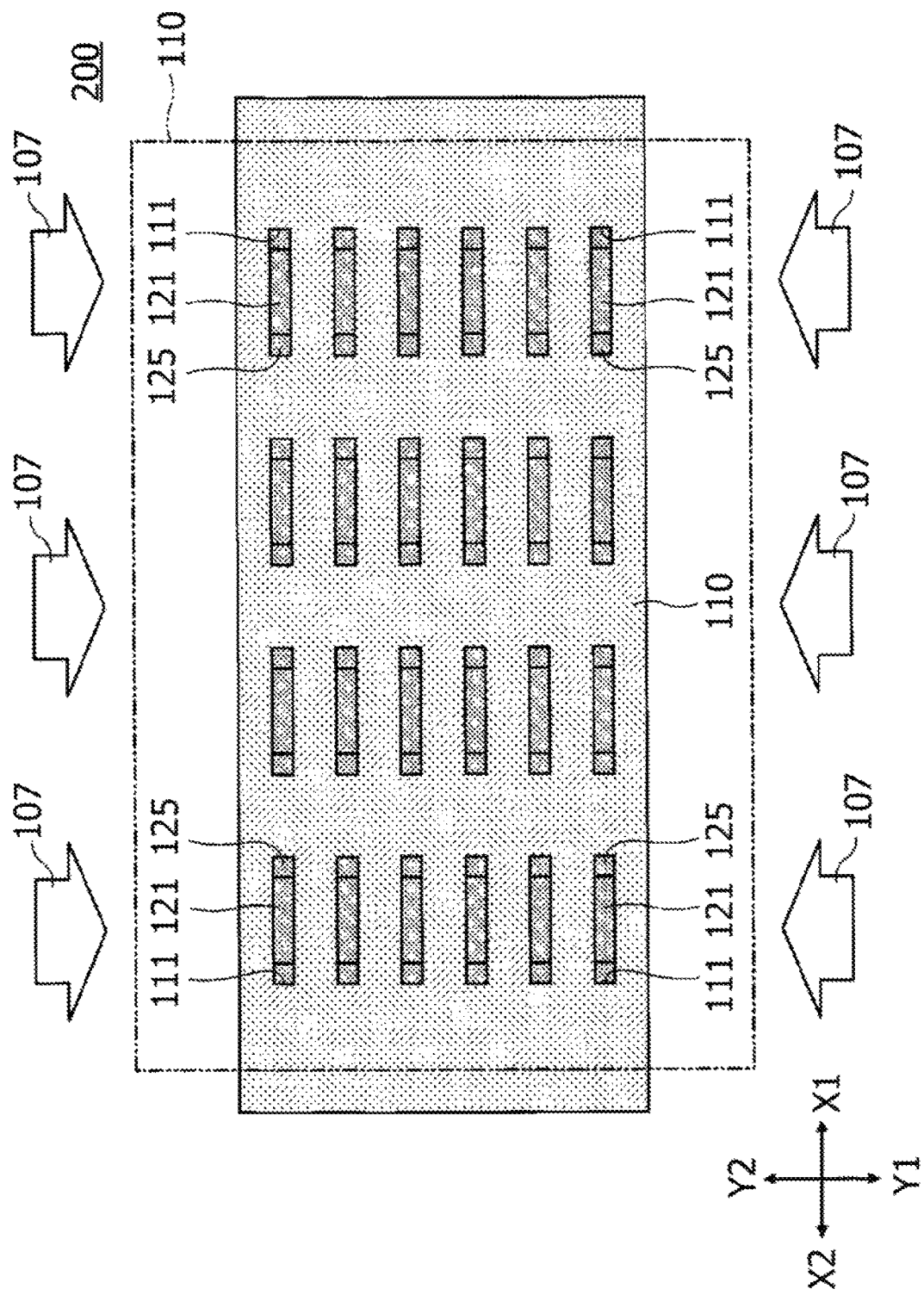
FIG. 25 is a diagram (No. 3) illustrating the method of manufacturing the heat sink according to the second embodiment.

According to the second embodiment, the shape of the base plate 110 before the application of the compressive loads 107 is changed from that of the first embodiment so as to suppress the bending of the base plate 110 in the Z1-Z2 direction. FIGS. 23 to 25 illustrate a method of manufacturing a heat sink 200 according to the second embodiment.

First, as is the case with the first embodiment, the metal plate 105 is prepared, and a plurality of base plates 110 and the plurality of fins 120 are cut out of the metal plate 105. In this case, the fins 120 may have the same shape as that of the first embodiment.

As illustrated in FIG. 23, two types of the through holes 111 having different sizes in the Y1-Y2 direction are formed in the base plate 110. One group is an outer group 111P that includes, out of the through holes 111 arranged in a rectangular array shape when seen from the Z1-Z2 direction, the through holes 111 disposed outermost and adjacent to one another in the X1-X2 direction or the Y1-Y2 direction. The other group is an inner group 111C that includes the through holes 111 disposed at a central portion and adjacent to one another in the X1-X2 direction or the Y1-Y2 direction. In the Y1-Y2 direction, a dimension W1C of the through holes 111 belonging to the inner group 111C is made to be larger than a dimension W1P of the through holes 111 belonging to the outer group 111P. The dimension W1C and the dimension W1P are made to be larger than the thickness t of the fin 120. FIG. 23 is a top view illustrating the base plate 110 cut out of the metal plate 105 according to the second embodiment. Neither the number of through holes 111 belonging to the outer group 111P nor the number of through holes 111 belonging to the inner group 111C is limited. The position of the boundary between the outer group 111P and the inner group 111C is not particularly limited. However, it is preferable that the boundary between the outer group 111P and the inner group 111C be a rectangle in which two sides extend in the X1-X2 direction and two sides other than the two sides extending in the X1-X2 direction extend in the Y1-Y2 direction.

Then, temporary assembly is performed by inserting the projections 121 of the fins 120 into the respective through holes 111 of the base plate 110. The dimension L1 of the through holes 111 is larger than the dimension L2 of the projections 121 in the X1-X2 direction, and the dimensions W1C and W1P of the through holes 111 in the Y1-Y2 direction are larger than the thickness t of the fins 120. Thus, as illustrated in FIG. 24, gaps are formed between the projections 121 and the through holes 111. FIG. 24 is a bottom view illustrating the base plate 110 and the fins 120 after the temporary assembly according to the second embodiment.

Next, as illustrated in FIG. 25, the compressive loads 107 are applied to the base plate 110 in the Y1-Y2 direction while the temporary assembly state is maintained. As a result, the through holes 111 are flattened in the Y1-Y2 direction, and the end surfaces 122 of the projections 121 are, in the Y1-Y2 direction, brought into contact with and brought into intimate contact with the inner wall surfaces 112 of the through holes 111 entirely in the Z1-Z2 direction. Thus, the fins 120 are secured to the base plate 110. FIG. 25 is a bottom view illustrating the base plate 110 and the fins 120 after the fins 120 have been secured to the base plate 110.

In this way, the heat sink 200 according to the second embodiment is able to be manufactured.

According to the second embodiment, in the Y1-Y2 direction, the dimension W1C of the through holes 111 belonging to the inner group 111C is larger than the dimension W1P of the through holes 111 belonging to the outer group 111P. Thus, even when the stress acting on the base plate 110 becomes larger as the distance from the center reduces in the X1-X2 direction or the Y1-Y2 direction, the difference between timing at which the through holes 111 belonging to the inner group 111C are flattened and timing at which the through holes 111 belonging to the outer group 111P are flattened may be reduced. Accordingly, the bending of the base plate 110 in the Z1-Z2 direction may be suppressed.

As illustrated in FIG. 23, in the Y1-Y2 direction, the distance between the through holes 111 belonging to the inner group 111C is smaller than the distance between the through holes 111 belonging to the outer group 111P. Thus, in the heat sink 200, in the Y1-Y2 direction, the mass of the base plate 110 per unit area of the XY plane is smaller in portions between the through holes 111 belonging to the inner group 111C than that in portions between the through holes 111 belonging to the outer group 111P. Also in the heat sink 200, in the Y1-Y2 direction, the thickness of the base plate 110 is smaller in the portions between the through holes 111 belonging to the inner group 111C than that in the portions between the through holes 111 belonging to the outer group 111P. The heat sink 200 is different from the heat sink 100 also in terms of the mass per unit area and the distribution of the thickness as described above.

Third Embodiment

Figure 26:
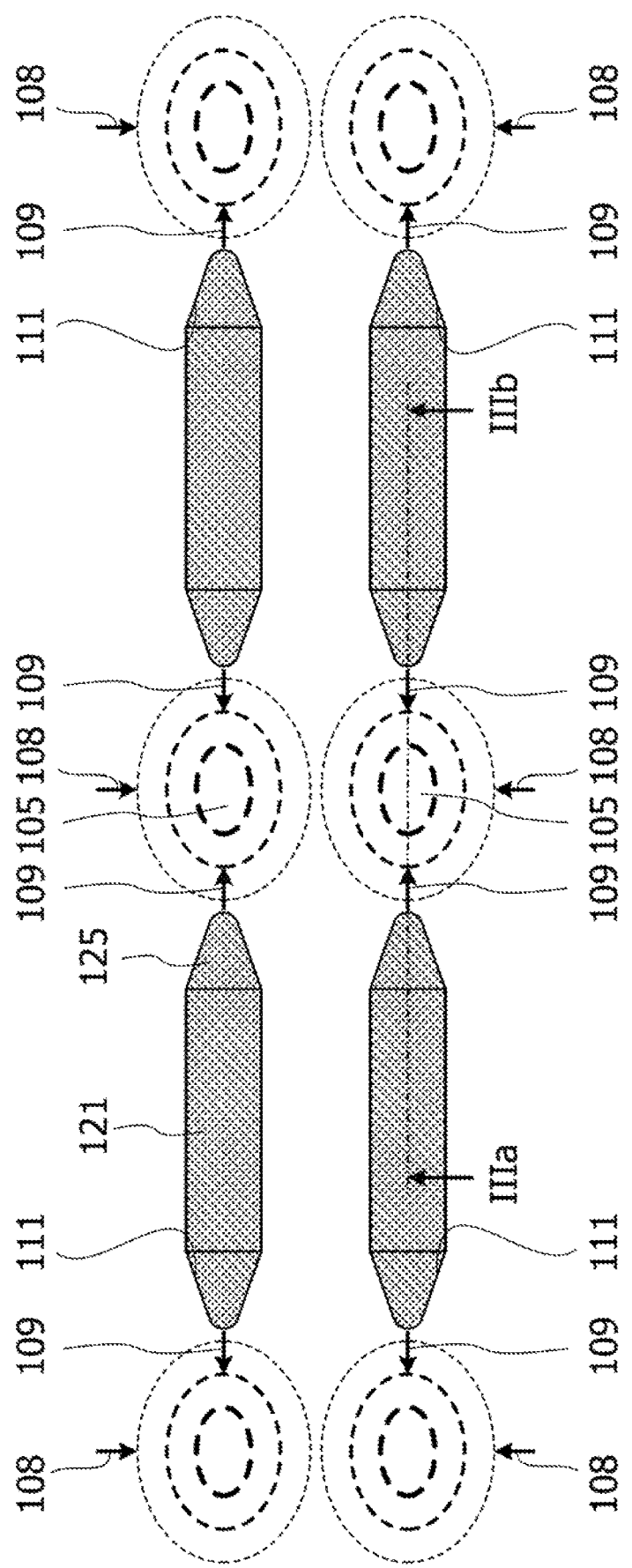
FIG. 26 is a bottom view schematically illustrating the distribution of stress locally acting on the base plate when the compressive loads are applied according to the second embodiment.

Next, a third embodiment is described. The third embodiment differs from the second embodiment in the shape of the base plate 110 before the application of the compressive loads 107. FIG. 26 is a bottom view schematically illustrating the distribution of stress locally acting on the base plate 110 when the compressive loads 107 are applied according to the second embodiment. Three types of dashed line ovals in FIG. 26 schematically illustrate the distribution of stress. The thicker an oval is, the larger the stress is.

Figure 27:
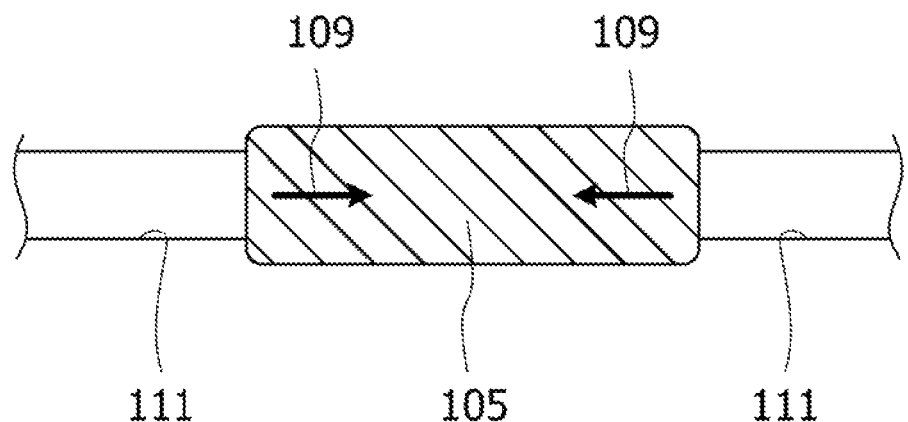
FIG. 27 is a sectional view illustrating a state of a portion between through holes according to the second embodiment.

As illustrated in FIG. 26, when the compressive loads 107 are applied to the base plate 110, the through holes 111 are not only flattened in the Y1-Y2 direction but also extend in the X1-X2 direction. Thus, in the base plate 110, not only the compressive stress 108 from the compressive loads 107 but also compressive stress 109 in the X1-X2 direction act on portions 115 between the adjacent through holes 111 in the X1-X2 direction. As a result, as illustrated in FIG. 27, the portions 115 are enlarged in the Z1-Z2 direction. Such enlargement of the portions 115 may lead to formation of gaps between the portions and the heat-generating component. Also, this may increase the likelihood of the occurrences of the bending of the base plate 110 as illustrated in FIG. 22. FIG. 27 is a sectional view illustrating a state of a portion 115 according to the second embodiment. FIG. 27 corresponds to a sectional view taken along line IIIc-IIIb in FIG. 26.

Figure 28:
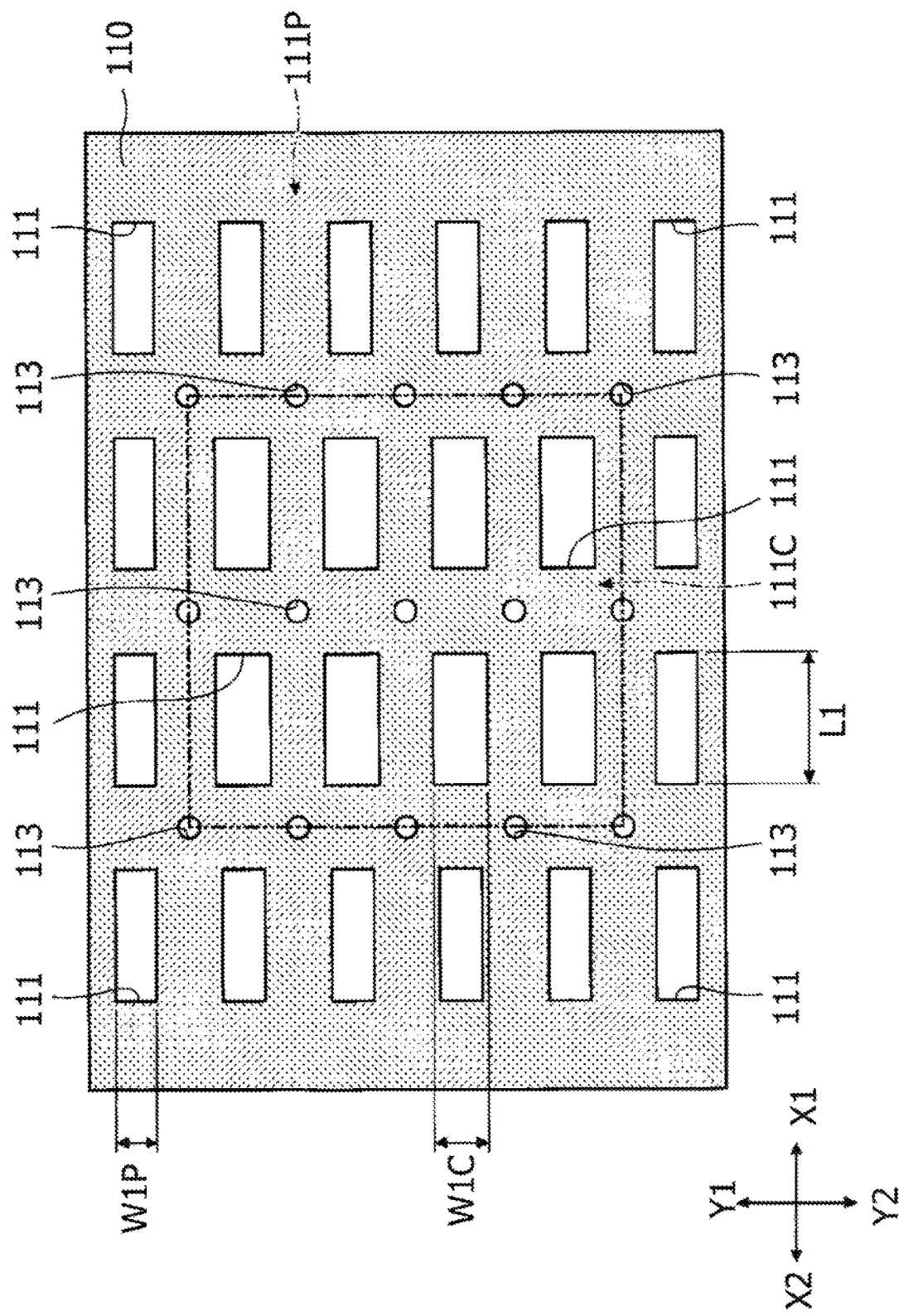
FIG. 28 is a diagram (No. 1) illustrating a method of manufacturing a heat sink according to a third embodiment.
Figure 29:
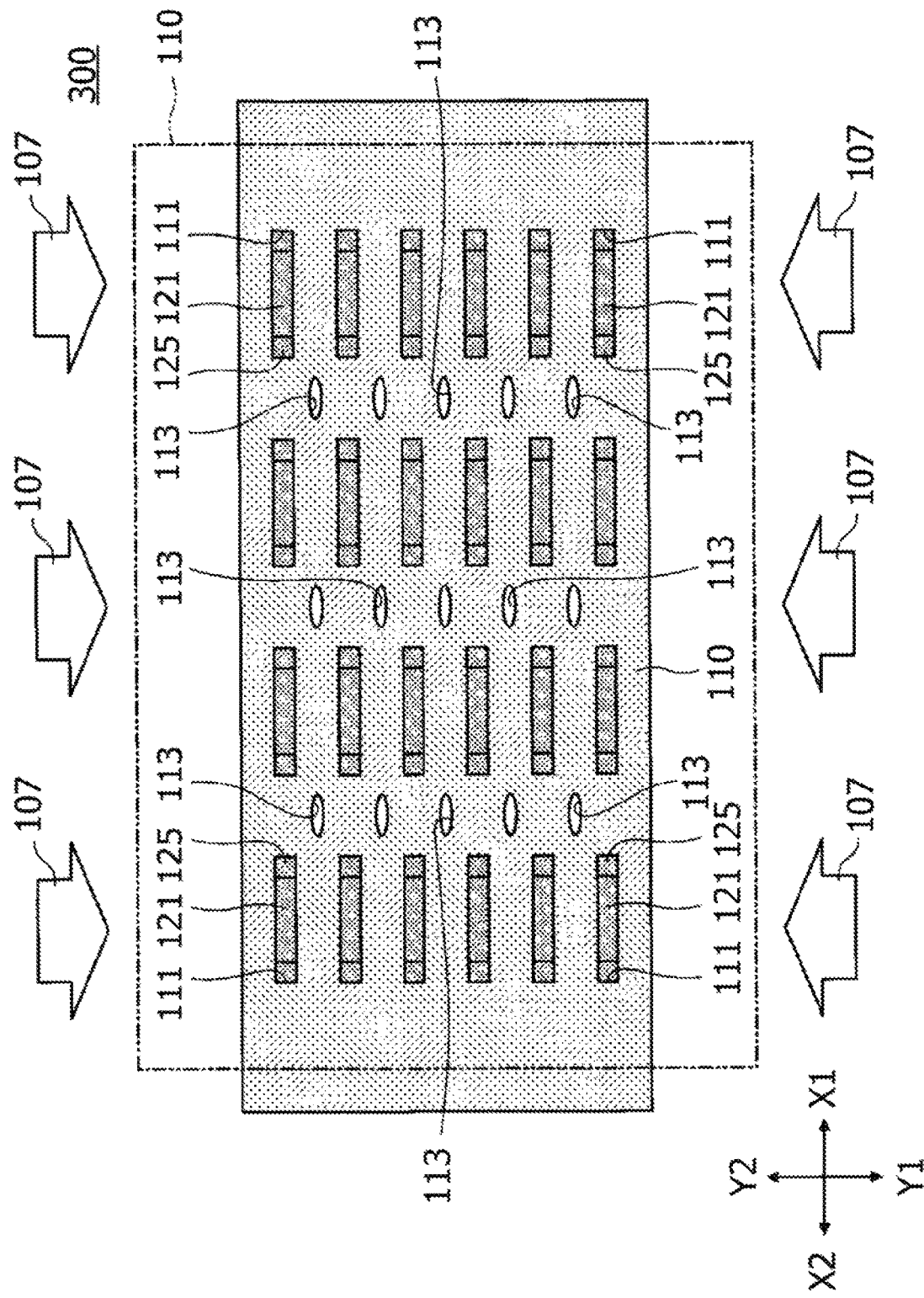
FIG. 29 is a diagram (No. 2) illustrating the method of manufacturing the heat sink according to the third embodiment.

According to the third embodiment, the shape of the base plate 110 before the application of the compressive loads 107 is changed from that of the second embodiment so as to suppress the enlargement of the portions 115. FIGS. 28 and 29 illustrate a method of manufacturing a heat sink 300 according to the third embodiment.

First, as is the case with the second embodiment, the metal plate 105 is prepared, and a plurality of base plates 110 and the plurality of fins 120 are cut out of the metal plate 105. In this case, the fins 120 may have the same shape as that of the first embodiment.

As is the case with the second embodiment, two types of the through holes 111 having different sizes in the Y1-Y2 direction are formed in the base plate 110. In addition, as illustrated in FIG. 28, through holes 113 having, for example, a circular shape in plan view are formed at the substantially centers of all two-by-two rectangular arrays formed by the through holes 111. The opening area of the through hole 113 is made to be smaller than the opening area of the through holes 111 belonging to the outer group 111P. FIG. 28 is a top view illustrating the base plate 110 cut out of the metal plate 105 according to the third embodiment.

Then, temporary assembly is performed by inserting the projections 121 of the fins 120 into the respective through holes 111 of the base plate 110. The dimension L1 of the through holes 111 is larger than the dimension L2 of the projections 121 in the X1-X2 direction, and the dimensions W1C and W1P of the through holes 111 in the Y1-Y2 direction are larger than the thickness t of the fins 120. Thus, gaps are formed between the projections 121 and the through holes 111 (see FIG. 24).

Next, as illustrated in FIG. 29, the compressive loads 107 are applied to the base plate 110 in the Y1-Y2 direction while the temporary assembly state is maintained. As a result, the through holes 111 are flattened in the Y1-Y2 direction, and the end surfaces 122 of the projections 121 are, in the Y1-Y2 direction, brought into contact with and brought into intimate contact with the inner wall surfaces 112 of the through holes 111 entirely in the Z1-Z2 direction. Thus, the fins 120 are secured to the base plate 110. FIG. 29 is a bottom view illustrating the base plate 110 and the fins 120 after the fins 120 have been secured to the base plate 110.

In this way, the heat sink 300 according to the third embodiment is able to be manufactured.

Figure 30:
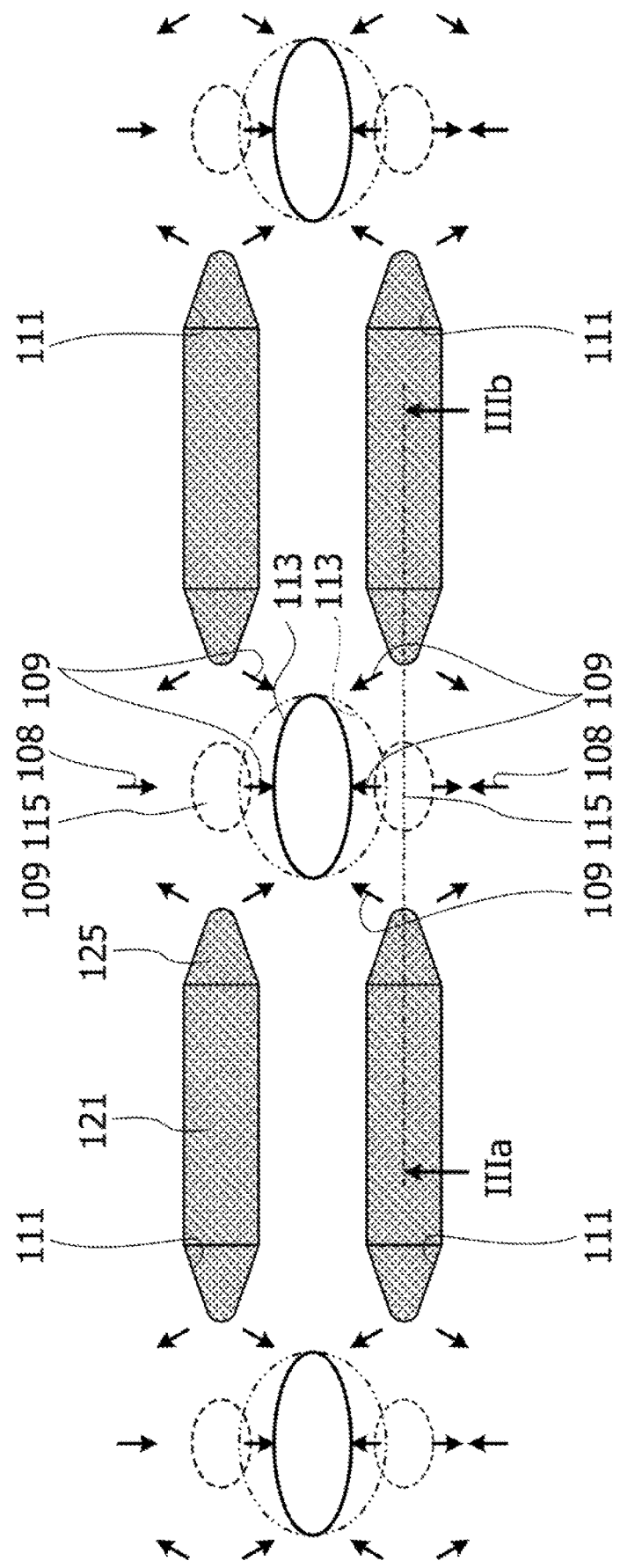
FIG. 30 is a bottom view schematically illustrating the distribution of stress locally acting on the base plate when the compressive loads are applied according to the third embodiment.
Figure 31:
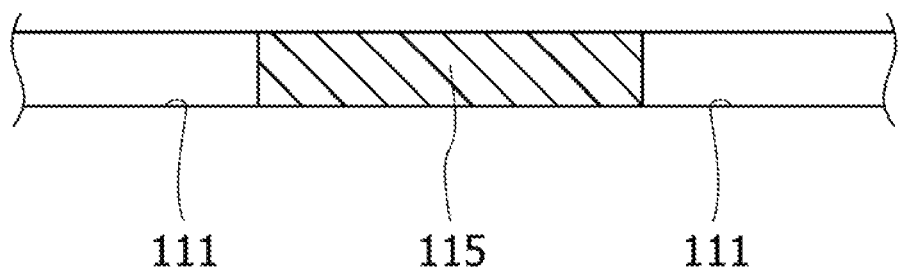
FIG. 31 is a sectional view illustrating a state of the portion between the through holes according to the third embodiment.

According to the third embodiment, the through holes 113 are formed at the substantially centers of all the two-by-two rectangular arrays formed by the through holes 111. Accordingly, as illustrated in FIG. 30, the stress due to extension of the through holes 111 in the X1-X2 direction is directed toward the through holes 113, and the through holes 113 are compressed. Thus, the compressive stress 109 acting on the portions 115 is reduced. Accordingly, as illustrated in FIG. 31, the enlargement of the portions 115 may be suppressed. FIG. 30 is a bottom view schematically illustrating the distribution of stress locally acting on the base plate 110 when the compressive loads 107 are applied according to the third embodiment. FIG. 31 is a sectional view illustrating a state of the portion 115 according to the third embodiment. FIG. 31 corresponds to a sectional view taken along line IIIc-IIIb in FIG. 30.

As illustrated in FIG. 29, in the heat sink 300, the through hole 113 is formed at the substantially centers of all the two-by-two rectangular arrays formed by the through holes 111. The difference between the heat sink 300 and the heat sink 200 is that the through holes 113 are formed in the heat sink 300.

In the first embodiment, the through holes 113 may be formed in the base plate 110 as is the case with the third embodiment.

Figure 32:
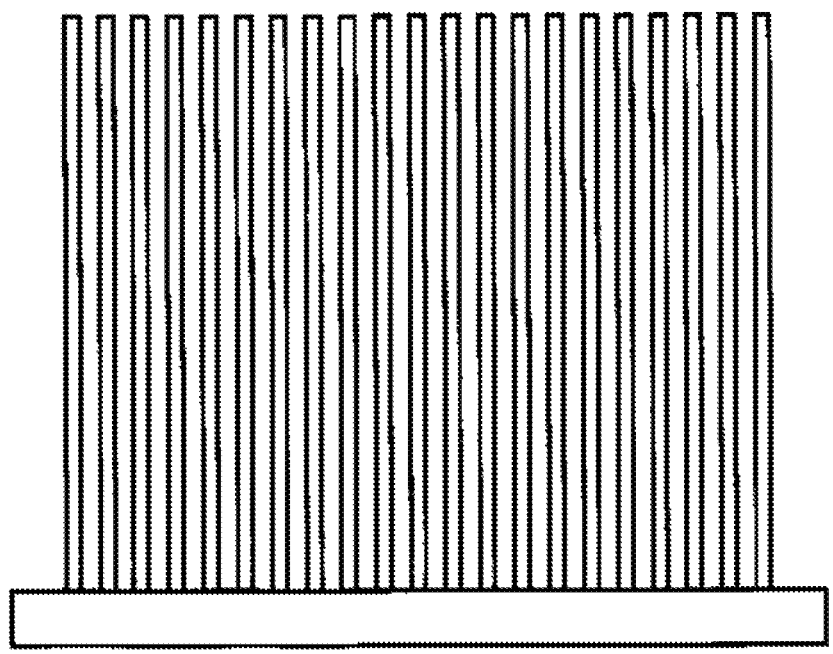
FIG. 32 is a side view illustrating a modification of fins.
Figure 33:
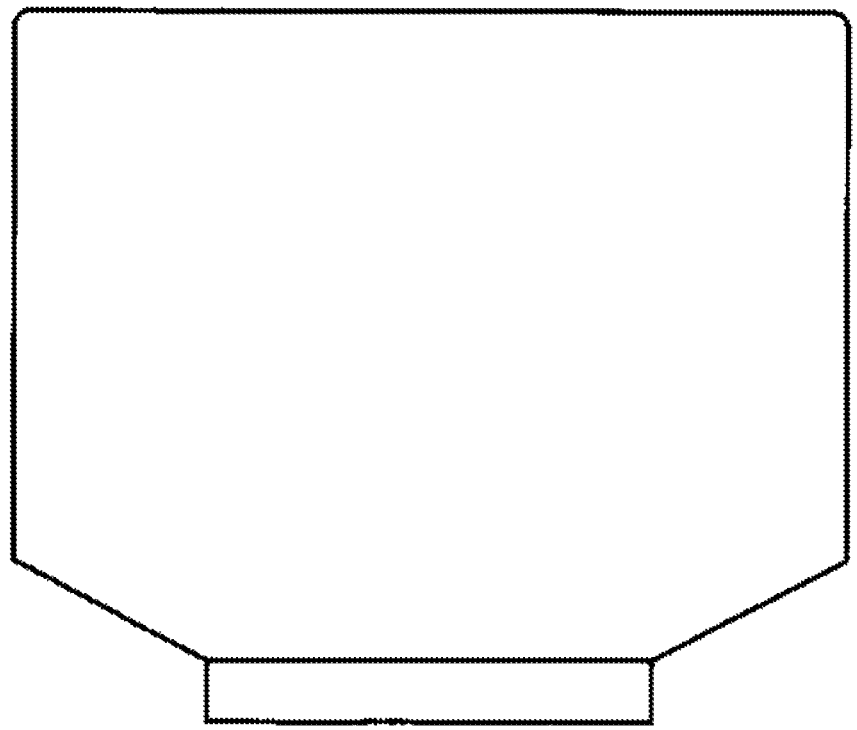
FIG. 33 is a front view illustrating the modification of the fins.
Figure 34:
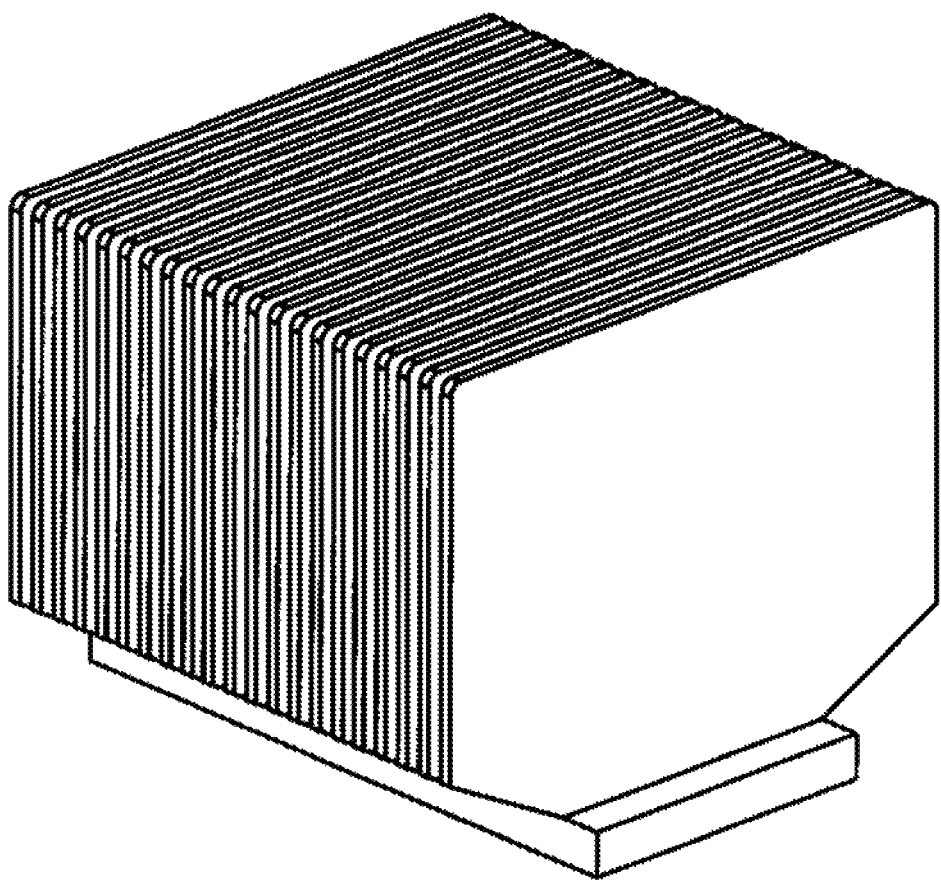
FIG. 34 is a perspective view illustrating the modification of the fins.

The shape of the fins 120 is not limited. FIG. 32 is a side view illustrating a modification of the fins 120. FIG. 33 is a front view illustrating the modification of the fins 120. FIG. 34 is a perspective view illustrating the modification of the fins 120. As illustrated in FIGS. 32 to 34, the planar shape of the fins 120 may be a hexagon formed by combining a trapezoid with a rectangle.

Fourth Embodiment

Figure 35:
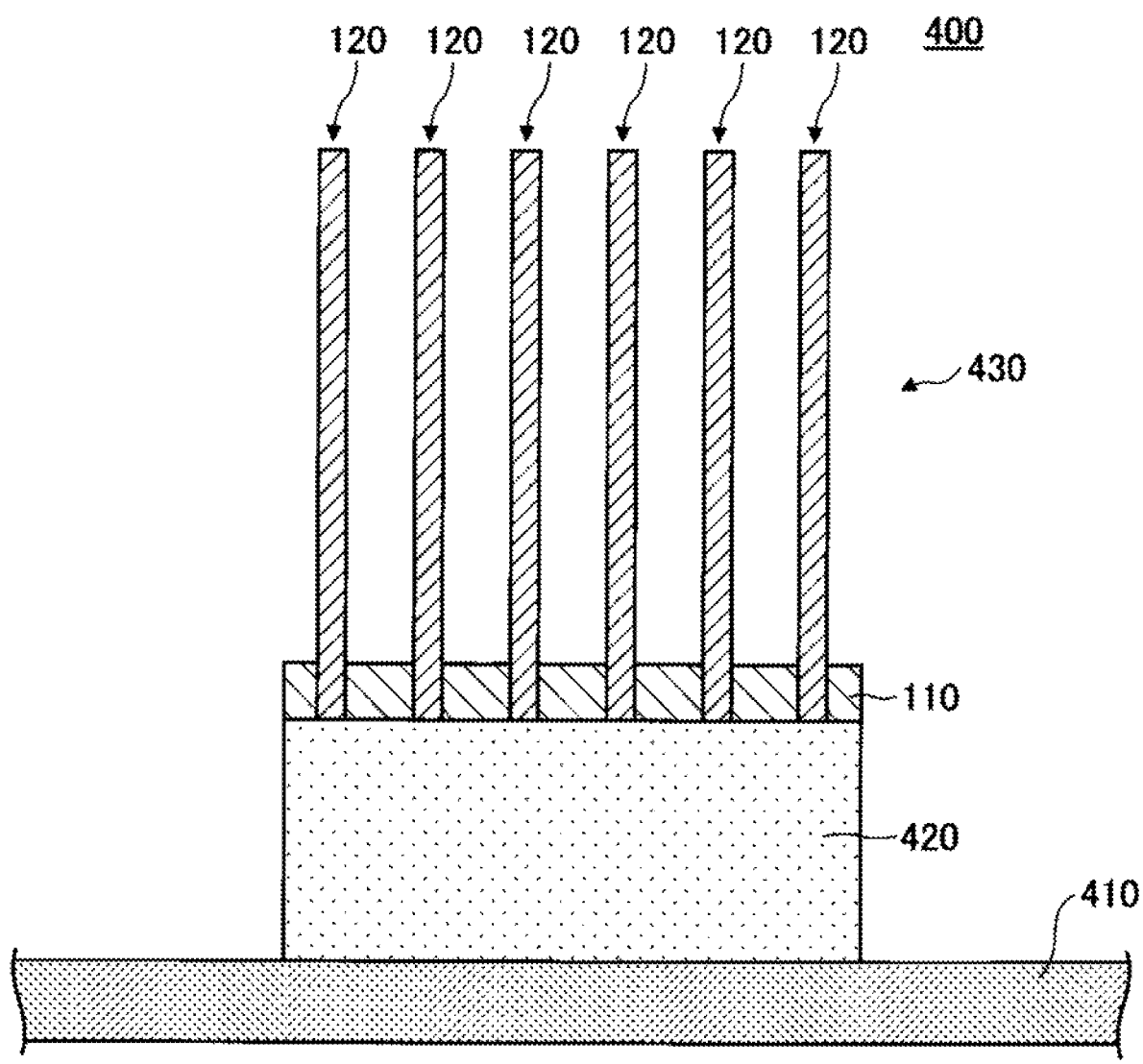
FIG. 35 is a sectional view illustrating a board module according to a fourth embodiment.

Next, a fourth embodiment is described. The fourth embodiment is related to a board module including a heat sink. FIG. 35 is a sectional view illustrating the board module according to the fourth embodiment.

As illustrated in FIG. 35, a board module 400 according to the fourth embodiment includes a board 410, a heat-generating component 420 provided over the board 410, and a heat sink 430 provided over the heat-generating component 420. The board 410 is, for example, a circuit board. The heat-generating component 420 is, for example, a semiconductor chip such as an integrated circuit (IC) chip. The heat sink 430 is the heat sink 100, the heat sink 200 or the heat sink 300 and includes the base plate 110 and the fins 120.

With the board module 400, heat generated by the heat-generating component 420 is dissipated to the outside through the heat sink 430. Since the heat sink 430 is the heat sink 100, the heat sink 200, or the heat sink 300, heat may be dissipated with high efficiency. For example, good heat dissipation performance may be obtained.

Fifth Embodiment

Figure 36:
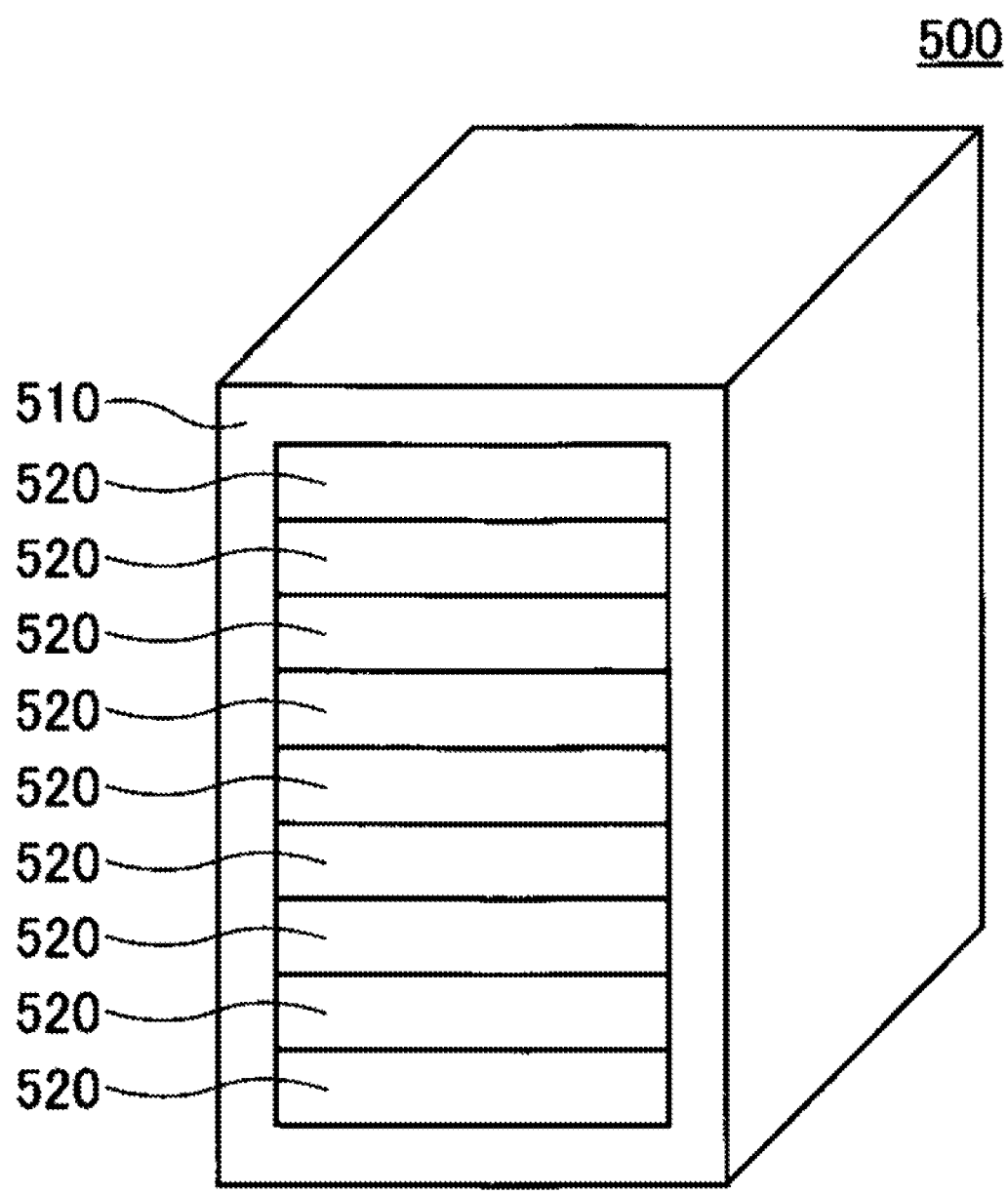
FIG. 36 is a perspective view illustrating a transmission device according to a fifth embodiment.

Next, a fifth embodiment is described. The fifth embodiment is related to a transmission device including the board module. FIG. 36 is a perspective view illustrating the transmission device according to the fifth embodiment.

As illustrated in FIG. 36, a transmission device 500 according to the fifth embodiment includes a housing 510 and a plurality of board modules 520 housed in the housing 510. At least one of the board modules 520 is the board module 400, and the heat-generating component 420 included in this board module 400 has a function of processing transmission and reception of signals to and from the outside of the transmission device 500.

In the transmission device 500, the heat-generating component 420 having the function of processing transmission and reception of signals may generate a large amount of heat. However, the heat dissipation performance of the board module 400 is good, and accordingly, the heat dissipation performance of the transmission device 500 may be improved. Thus, high reliability may be obtained.

Although the preferred embodiments and the like have been described in detail, the above-described embodiments and the like are not limiting. Various modifications and various types of replacement may be added to the above-described embodiments and the like without departing from the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A heat sink comprising:
   a base plate; and
   at least one fin secured to the base plate; wherein
   the base plate has a plurality of first through holes each of which extends in a first direction and a second direction, the first direction being a direction parallel to a surface of the base plate, the second direction being a direction that is parallel to the surface of the base plate and that is perpendicular to the first direction, wherein
   each of the at least one fin has at least one projection each of which inserted into a corresponding first through hole among the plurality of first through holes, each of the at least one projection having a first side and a second side each with an end surface, and wherein,
   both end surfaces of each of the at least one projection are in contact with inner wall surfaces of the corresponding through hole entirely in a third direction parallel to a thickness direction of the base plate,
   the base plate has one or more of second through holes each of which is formed between an adjacent pair of first through holes among the plurality of first through holes, each of the one or more of second through holes being a through hole formed to alleviate a compressive stress from a compressive load applied to the base plate in at least any of the first direction or the second direction.

2. The heat sink according to claim 1, wherein
the at least one fin includes a plurality of fins, wherein
the plurality of first through holes are arranged in a rectangular array shape in the first direction and the second direction, and wherein
the plurality of fins are arranged in the second direction.

3. The heat sink according to claim 2, wherein,
when the plurality of first through holes are classified into a first group and a second group, the first group being a group that includes, out of the plurality of through holes, through holes disposed outermost and adjacent to one another in the first direction or the second direction, the second group being a group that includes, out of the plurality of through holes, through holes disposed in a central portion and adjacent to one another in the first direction or the second direction,
in the second direction, a mass of the base plate per unit area of the surface of the base plate is smaller in a portion between the through holes included in the second group than in a portion between the through holes included in the first group.

4. The heat sink according to claim 2, wherein
each of the one or more second through holes being a second through hole having a smaller opening area than an opening area of each of the plurality of first through holes is formed on an inner side of a rectangular array formed by four of the plurality of first through holes of the base plate.

5. A board module comprising:
a board;
a heat-generating component provided over the board; and
the heat sink according to of claim 1 provided over the heat-generating component.

6. A transmission device comprising:
the board module according to claim 5; and
a housing that houses the board module.

7. A method of manufacturing a heat sink, the method comprising:
preparing a base plate having a plurality of first through holes each of which extends in a first direction and a second direction, the first direction being a direction parallel to a surface of the base plate, the second direction being a direction that is parallel to the surface of the base plate and that is perpendicular to the first direction;
preparing at least one fin, each of the at least one fin having at least one projection each of which inserted into a corresponding first through hole among the plurality of first through holes, each of the at least one projection having a first side and a second side each with an end surface;
performing temporary assembly of the at least one fin and the base plate with each other by inserting each of the at least one projection into the corresponding first through hole from among the plurality of first through holes; and
bringing both end surfaces of each of the at least one projection into contact with inner wall surfaces of the corresponding first through hole entirely in a third direction parallel to a thickness direction of the base plate by compressing the base plate in a second direction that is parallel to the surface of the base plate and that is perpendicular to the first direction, wherein the base plate has one or more of second through holes each of which is formed between an adjacent pair of first through holes among the plurality of first through holes, each of the one or more of second through holes being a through hole formed to alleviate a compressive stress from a compressive load applied to the base plate in at least any of the first direction or the second direction.

8. The method according to claim 7, wherein
the at least one fin includes a plurality of fins, wherein
the plurality of first through holes are arranged in a rectangular array shape in the first direction and the second direction, and wherein
the plurality of fins are arranged in the second direction.

9. The method according to claim 8, wherein,
when the plurality of first through holes are classified into a first group and a second group, the first group being a group that includes, out of the plurality of through holes, through holes disposed outermost and adjacent to one another in the first direction or the second direction, the second group being a group that includes, out of the plurality of through holes, through holes disposed in a central portion and adjacent to one another in the first direction or the second direction,
in the second direction, a dimension of the through holes included in the second group is larger than a dimension of the through holes included in the first group.

10. The method according to claim 8, wherein,
each of the one or more second through holes is a second through hole disposed on an inner side of a rectangular array formed by four of the plurality of first through holes is prepared, and wherein
each of the one or more second through holes has a smaller opening area than an opening area of each of the plurality of first through holes.

* * * * *